US006901221B1

(12) United States Patent
Jiang et al.

(10) Patent No.: US 6,901,221 B1
(45) Date of Patent: May 31, 2005

(54) METHOD AND APPARATUS FOR IMPROVED OPTICAL ELEMENTS FOR VERTICAL PCB FIBER OPTIC MODULES

(75) Inventors: Wenbin Jiang, Calabasas, CA (US); Cheng Ping Wei, Gilbert, AZ (US); Tom D. Milster, Tucson, AZ (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/321,308

(22) Filed: May 27, 1999

(51) Int. Cl.[7] .......................... H04B 10/02; H04B 10/12
(52) U.S. Cl. .......................... 398/138; 385/14; 385/92; 385/24
(58) Field of Search .................... 359/163, 152; 385/92, 14, 24; 398/135, 138, 139

(56) References Cited

U.S. PATENT DOCUMENTS

| | | | |
|---|---|---|---|
| 2,949,595 A | | 8/1960 | Doeleman |
| 3,335,387 A | | 8/1967 | Mueller |
| 3,385,970 A | | 5/1968 | Coffin, Jr. et al. |
| 3,395,331 A | | 7/1968 | Snitzer |
| 3,423,594 A | | 1/1969 | Galopin |
| 3,492,058 A | | 1/1970 | Waldman |
| 3,564,231 A | | 2/1971 | Bruce |
| 3,582,637 A | | 6/1971 | Cecil, Jr. |

(Continued)

FOREIGN PATENT DOCUMENTS

| | | |
|---|---|---|
| EP | 0 448 989 A1 | 10/1991 |
| EP | 0 652 696 A1 | 11/1994 |
| JP | 1098299 | 4/1989 |
| JP | 8194129 | 7/1996 |
| JP | 8248277 | 9/1996 |
| JP | 408321627 A | 12/1996 |
| JP | 9171127 | 6/1997 |
| WO | WO 99/54772 | 10/1999 |

OTHER PUBLICATIONS

A. Mickelson, N. Basabanhally & Yung–Cheng Lee; Opto–electronic Packaging; 1997; pp. 79–101 & 231–250; John Wiley & Sons, Inc. New York, NY.

Erik Van Der Bij; Optical Lind Cards (OLC) & Gigabaud Link Modules (GLM); Apr. 23, 1998; http://hsi.web.cern.ch/HSI/fcs/comps/olcglm.htm.

R.T. Chen and P.S. Guilfoyle (Eds.); Optoelectronic Interconnects And Packaging; *Critical Reviews* vol. CR62; (1996); pp. 48–63; 64–67; 229–243; 393–404; 405–414; 442–460; Spie Optical Engineering Press; Washington.

(Continued)

*Primary Examiner*—Jason Chan
*Assistant Examiner*—Agustin Bello
(74) *Attorney, Agent, or Firm*—Allen, Dyer, Doppelt Milbrath & Gilchrist, P.A.

(57) ABSTRACT

Fiber optic transmitter and receiver electrical elements are implemented on separate vertical boards in fiber optic modules. An optical block implements lenses and reflecting surfaces to minimize manufacturing costs. The light receiver and light transmitter are mounted to receive and transmit non-orthogonal to the fiber axis to avoid optical cross talk. In one embodiment, receiver and transmitter are mounted at an angle greater than forty-five degrees with a perpendicular line to the reflective surfaces. In another embodiment, receiver and transmitter are mounted at an angle less than forty-five degrees with a perpendicular line to the reflective surfaces. The reflective surface for transmission may be a beam shaper to improve light beam uniformity and optical coupling and to avoid active alignment. The vertical boards have ground planes facing each other to minimize electrical cross talk. An optional shielded housing provides further shielding for reducing EMI.

63 Claims, 21 Drawing Sheets

U.S. PATENT DOCUMENTS

| | | | |
|---|---|---|---|
| 3,624,385 A | 11/1971 | Wall | |
| 3,628,036 A | 12/1971 | Humphrey | |
| 3,663,822 A | 5/1972 | Uchida | |
| 3,712,984 A | 1/1973 | Lienhard | |
| 3,721,815 A | 3/1973 | Wall | |
| 3,724,383 A | 4/1973 | Gallaghan et al. | |
| 3,756,688 A | 9/1973 | Hudson et al. | |
| 3,758,784 A | 9/1973 | Vischulis | |
| 3,780,295 A | 12/1973 | Kapron et al. | |
| 3,790,791 A | 2/1974 | Anderson | |
| 3,792,208 A | 2/1974 | Meyer | |
| 3,792,284 A | 2/1974 | Kaelin | |
| 3,800,388 A | 4/1974 | Borner et al. | |
| 3,803,409 A | 4/1974 | Prochazka | |
| 3,803,511 A | 4/1974 | Thompson | |
| 3,808,549 A | 4/1974 | Maurer | |
| 3,809,908 A | 5/1974 | Clanton | |
| 3,814,933 A | 6/1974 | Weber | |
| 3,842,257 A | 10/1974 | Kohler | |
| 3,842,262 A | 10/1974 | Heitman et al. | |
| 3,859,536 A | 1/1975 | Thiel | |
| 3,864,016 A | 2/1975 | Dakss et al. | |
| 3,870,396 A | 3/1975 | Racki et al. | |
| 3,878,397 A | 4/1975 | Robb et al. | |
| 3,887,803 A | 6/1975 | Savage, Jr. | |
| 3,892,962 A | 7/1975 | Whited | |
| 3,894,789 A | 7/1975 | Kobayashi et al. | |
| 3,896,305 A | 7/1975 | Ostrowsky et al. | |
| 3,932,761 A | 1/1976 | Ramsey et al. | |
| 3,950,075 A | 4/1976 | Cook et al. | |
| 3,963,920 A | 6/1976 | Palmer | |
| 3,968,564 A | 7/1976 | Springthorpe | |
| 3,976,877 A | 8/1976 | Thillays | |
| 3,995,935 A | 12/1976 | McCartney | |
| 4,007,978 A | 2/1977 | Holton | |
| 4,030,811 A | 6/1977 | Khoe et al. | |
| 4,045,120 A | 8/1977 | de Corlieu et al. | |
| 4,056,299 A | 11/1977 | Paige | |
| 4,060,309 A | 11/1977 | Le Noane et al. | |
| 4,065,203 A | 12/1977 | Goell et al. | |
| 4,075,477 A | 2/1978 | Hanson | |
| 4,076,376 A | 2/1978 | Slaughter | |
| 4,102,559 A | 7/1978 | Hunzinger | |
| 4,118,100 A | 10/1978 | Goell et al. | |
| 4,119,362 A | 10/1978 | Holzman | |
| 4,130,343 A | 12/1978 | Miller et al. | |
| 4,136,357 A | 1/1979 | Frederiksen | |
| 4,144,541 A | 3/1979 | Schaefer et al. | |
| 4,149,072 A | 4/1979 | Smith et al. | |
| 4,156,206 A | 5/1979 | Comerford et al. | |
| 4,161,650 A | 7/1979 | Caouette et al. | |
| 4,166,668 A | 9/1979 | MacLeod | |
| 4,167,303 A | 9/1979 | Bowen et al. | |
| 4,168,883 A | 9/1979 | MacLeod | |
| 4,169,656 A | 10/1979 | Hodge | |
| 4,170,399 A | 10/1979 | Hansen et al. | |
| 4,179,801 A | 12/1979 | Hollis | |
| 4,181,401 A | 1/1980 | Jensen | |
| 4,182,545 A | 1/1980 | Greer | |
| 4,184,741 A | 1/1980 | Hawk et al. | |
| 4,186,994 A | 2/1980 | Denken et al. | |
| 4,186,995 A | 2/1980 | Schumacher | |
| 4,190,767 A | 2/1980 | Crouse | |
| 4,199,222 A | 4/1980 | Ikushima et al. | |
| 4,204,743 A | 5/1980 | Etaix | |
| 4,217,030 A | 8/1980 | Howarth | |
| 4,229,067 A | 10/1980 | Love | 350/96.15 |
| 4,237,474 A | 12/1980 | Ladany | |
| 4,252,402 A | 2/1981 | Puech et al. | |
| 4,257,672 A | 3/1981 | Balliet | |
| 4,268,114 A | 5/1981 | d'Auria et al. | |
| 4,268,115 A | 5/1981 | Slemon et al. | |
| 4,268,756 A | 5/1981 | Crouse et al. | |
| 4,270,134 A | 5/1981 | Takeda et al. | |
| 4,273,413 A | 6/1981 | Bendikens et al. | |
| 4,276,656 A | 6/1981 | Petryk, Jr. | |
| 4,281,891 A | 8/1981 | Shinohara et al. | |
| 4,285,572 A | 8/1981 | Beaudette et al. | |
| 4,297,651 A | 10/1981 | Dyment et al. | |
| 4,302,070 A | 11/1981 | Nakayama et al. | |
| 4,307,934 A | 12/1981 | Palmer | |
| 4,311,359 A | 1/1982 | Keller | |
| 4,326,771 A | 4/1982 | Henry et al. | |
| 4,330,172 A | 5/1982 | Monaghan et al. | |
| 4,347,655 A | 9/1982 | Zory et al. | |
| 4,355,323 A | 10/1982 | Kock | |
| 4,357,072 A | 11/1982 | Goodfellow et al. | |
| 4,362,360 A | 12/1982 | Mannschke | |
| 4,378,954 A | 4/1983 | Baker | |
| 4,383,731 A | 5/1983 | Simon et al. | |
| 4,384,368 A | 5/1983 | Rosenfeldt et al. | |
| 4,387,956 A | 6/1983 | Cline | |
| 4,394,061 A | 7/1983 | Schroeder | |
| 4,399,453 A | 8/1983 | Berg et al. | |
| 4,399,487 A | 8/1983 | Neumann | |
| 4,399,541 A | 8/1983 | Kovats et al. | |
| 4,406,514 A | 9/1983 | Hillegonds et al. | |
| 4,408,353 A | 10/1983 | Bowen et al. | |
| 4,410,469 A | 10/1983 | Katagiri et al. | |
| 4,418,983 A | 12/1983 | Bowen et al. | |
| 4,427,879 A | 1/1984 | Becher et al. | |
| 4,431,261 A | 2/1984 | Kozikowski | |
| 4,432,604 A | 2/1984 | Schwab | |
| 4,435,037 A | 3/1984 | Abramson et al. | |
| 4,439,006 A | 3/1984 | Stevenson | |
| 4,446,515 A | 5/1984 | Sauer et al. | |
| 4,449,244 A | 5/1984 | Kopainsky | |
| 4,456,334 A | 6/1984 | Henry et al. | |
| 4,461,537 A | 7/1984 | Raymer, II et al. | |
| 4,465,333 A | 8/1984 | Caserta et al. | |
| 4,470,660 A | 9/1984 | Hillegonds et al. | |
| 4,471,414 A | 9/1984 | Savage, Jr. | |
| 4,479,696 A | 10/1984 | Lubin et al. | |
| 4,479,698 A | 10/1984 | Landis et al. | |
| 4,485,474 A | 11/1984 | Osterwalder | |
| 4,491,900 A | 1/1985 | Savage, Jr. | |
| 4,491,981 A | 1/1985 | Weller et al. | |
| 4,493,113 A | 1/1985 | Forrest et al. | |
| 4,523,802 A | 6/1985 | Sakaguchi et al. | |
| 4,527,285 A | 7/1985 | Kekas et al. | |
| 4,530,566 A | 7/1985 | Smith et al. | |
| 4,533,209 A | 8/1985 | Segerson et al. | |
| 4,534,616 A | 8/1985 | Bowen et al. | |
| 4,535,233 A | 8/1985 | Abraham | |
| 4,539,476 A | 9/1985 | Donuma et al. | |
| 4,542,076 A | 9/1985 | Bednarz et al. | |
| 4,549,782 A | 10/1985 | Miller | |
| 4,549,783 A | 10/1985 | Schmachtenberg, III | |
| 4,553,811 A | 11/1985 | Becker et al. | |
| 4,553,813 A | 11/1985 | McNaughton et al. | |
| D282,174 S | 1/1986 | Kikuchi et al. | |
| 4,566,134 A | 1/1986 | Harbour et al. | |
| 4,580,295 A | 4/1986 | Richman | |
| 4,591,711 A | 5/1986 | Taumberger | |
| 4,595,839 A | 6/1986 | Braun et al. | |
| 4,597,631 A | 7/1986 | Flores | |
| 4,602,164 A | 7/1986 | Gore, III et al. | |
| 4,611,886 A | 9/1986 | Cline et al. | |
| 4,612,670 A | 9/1986 | Henderson | |
| 4,615,031 A | 9/1986 | Eales et al. | |
| 4,616,899 A | 10/1986 | Schlafer | |

| | | | | | |
|---|---|---|---|---|---|
| 4,616,900 A | 10/1986 | Cairns | 4,913,511 A | 4/1990 | Tabalba et al. |
| 4,623,220 A | 11/1986 | Grabbe et al. | 4,915,470 A | 4/1990 | Moore et al. |
| 4,625,333 A | 11/1986 | Takezawa et al. | 4,918,702 A | 4/1990 | Kimura |
| 4,630,278 A | 12/1986 | Auffret et al. | 4,927,228 A | 5/1990 | Van De Pas |
| 4,645,295 A | 2/1987 | Pronovost | 4,944,568 A | 7/1990 | Danbach et al. |
| 4,647,148 A | 3/1987 | Katagiri | 4,945,229 A | 7/1990 | Daly et al. |
| 4,653,847 A | 3/1987 | Berg et al. | 4,945,400 A | 7/1990 | Blonder et al. |
| 4,661,959 A | 4/1987 | Kaneko | 4,962,990 A | 10/1990 | Matsuzawa et al. |
| 4,665,529 A | 5/1987 | Baer et al. | 4,969,924 A | 11/1990 | Suverison et al. |
| 4,668,044 A | 5/1987 | D'Auria et al. | 4,977,329 A | 12/1990 | Eckhardt et al. |
| 4,673,245 A | 6/1987 | Kling et al. | 4,979,787 A | 12/1990 | Lichtenberger |
| 4,678,264 A | 7/1987 | Bowen et al. | D314,176 S | 1/1991 | Weber et al. |
| 4,684,210 A | 8/1987 | Matsunaga et al. | 4,986,625 A | 1/1991 | Yamada et al. |
| 4,687,285 A | 8/1987 | Hily et al. | 4,989,934 A | 2/1991 | Zavracky et al. |
| 4,699,455 A | 10/1987 | Erbe et al. | 4,997,254 A | 3/1991 | Ganev |
| 4,701,010 A * | 10/1987 | Roberts .................. 385/31 | 5,005,178 A | 4/1991 | Kluitmans et al. |
| 4,701,013 A | 10/1987 | Jurczyszyn et al. | 5,005,939 A | 4/1991 | Arvanitakis et al. |
| 4,702,556 A | 10/1987 | Ishii et al. | 5,011,246 A | 4/1991 | Corradetti et al. |
| 4,705,351 A | 11/1987 | Toda | 5,011,249 A | 4/1991 | Diaz |
| 4,707,066 A | 11/1987 | Falkenstein et al. | 5,013,247 A | 5/1991 | Watson |
| 4,707,067 A | 11/1987 | Haberland et al. | 5,020,873 A | 6/1991 | Althaus et al. |
| 4,708,429 A | 11/1987 | Clark et al. | 5,026,134 A | 6/1991 | Sugawara et al. |
| 4,714,315 A | 12/1987 | Krause | 5,039,194 A | 8/1991 | Block et al. |
| 4,720,630 A | 1/1988 | Takeuchi et al. | 5,042,891 A | 8/1991 | Mulholland et al. |
| 4,722,337 A | 2/1988 | Losch et al. | 5,043,775 A | 8/1991 | Lee |
| 4,722,586 A | 2/1988 | Dodson et al. | 5,046,798 A | 9/1991 | Yagiu et al. |
| 4,726,648 A | 2/1988 | Haberland et al. | 5,047,835 A | 9/1991 | Chang |
| 4,727,248 A | 2/1988 | Meur et al. | 5,048,919 A | 9/1991 | Ladany |
| 4,730,198 A | 3/1988 | Brown et al. | 5,050,953 A | 9/1991 | Anderson et al. |
| 4,732,446 A | 3/1988 | Gipson et al. | 5,065,226 A | 11/1991 | Kluitmans et al. |
| 4,737,008 A | 4/1988 | Ohyama et al. | 5,067,785 A | 11/1991 | Schirbl et al. |
| 4,744,626 A | 5/1988 | Mery | 5,069,522 A | 12/1991 | Block et al. |
| 4,752,109 A | 6/1988 | Gordon et al. | 5,071,219 A | 12/1991 | Yurtin et al. |
| 4,756,590 A | 7/1988 | Forrest et al. | 5,073,045 A | 12/1991 | Abendschein |
| 4,756,592 A | 7/1988 | Sasayama et al. | 5,073,047 A | 12/1991 | Suzuki et al. |
| 4,756,593 A | 7/1988 | Koakutsu et al. | 5,074,682 A | 12/1991 | Uno et al. |
| 4,762,388 A | 8/1988 | Tanaka et al. | 5,078,515 A | 1/1992 | Soulard et al. |
| 4,762,395 A | 8/1988 | Gordon et al. | 5,091,991 A | 2/1992 | Briggs et al. |
| 4,763,225 A | 8/1988 | Frenkel et al. | 5,093,879 A | 3/1992 | Bregman et al. |
| 4,763,979 A | 8/1988 | Heywang | 5,099,307 A | 3/1992 | Go et al. |
| 4,767,178 A | 8/1988 | Sasaki et al. | 5,104,242 A | 4/1992 | Ishikawa |
| 4,767,179 A | 8/1988 | Sampson et al. | 5,104,243 A | 4/1992 | Harding |
| 4,778,240 A | 10/1988 | Komatsu | 5,107,537 A | 4/1992 | Schriks et al. |
| 4,783,137 A | 11/1988 | Kosman et al. | 5,109,453 A | 4/1992 | Edwards et al. |
| 4,787,706 A | 11/1988 | Cannon, Jr. et al. | 5,109,454 A | 4/1992 | Okuno et al. |
| 4,790,618 A | 12/1988 | Abe | 5,111,476 A | 5/1992 | Hollenbeck et al. |
| 4,798,440 A | 1/1989 | Hoffer et al. | 5,113,404 A | 5/1992 | Gaebe et al. |
| 4,799,757 A | 1/1989 | Goetter | 5,113,466 A | 5/1992 | Acarlar et al. |
| 4,802,178 A | 1/1989 | Ury | 5,113,467 A | 5/1992 | Peterson et al. |
| 4,803,361 A | 2/1989 | Aiki et al. | 5,117,474 A | 5/1992 | van den Bergh et al. |
| 4,803,689 A | 2/1989 | Shibanuma | 5,117,476 A | 5/1992 | Yingst et al. |
| 4,807,955 A | 2/1989 | Ashman et al. | 5,119,462 A | 6/1992 | Matsubara et al. |
| 4,807,956 A | 2/1989 | Tournereau et al. | 5,121,451 A | 6/1992 | Grard et al. |
| 4,820,013 A | 4/1989 | Fuse | 5,121,457 A | 6/1992 | Foley et al. |
| 4,834,490 A | 5/1989 | Falkenstein et al. | 5,122,893 A | 6/1992 | Tolbert |
| 4,834,491 A | 5/1989 | Aoki et al. | 5,124,281 A | 6/1992 | Ackerman et al. |
| 4,836,635 A | 6/1989 | De Amorim | 5,125,849 A | 6/1992 | Briggs et al. |
| 4,837,927 A | 6/1989 | Savage, Jr. | 5,127,071 A | 6/1992 | Go |
| 4,840,451 A | 6/1989 | Sampson et al. | 5,127,073 A | 6/1992 | Mulholland et al. |
| 4,844,581 A | 7/1989 | Turner | 5,127,074 A | 6/1992 | Watanabe et al. |
| 4,856,091 A | 8/1989 | Taska | 5,134,679 A | 7/1992 | Robin et al. |
| 4,861,134 A | 8/1989 | Alameel et al. | 5,136,152 A | 8/1992 | Lee |
| 4,863,233 A | 9/1989 | Nienaber et al. | 5,140,663 A | 8/1992 | Edwards et al. |
| 4,871,224 A | 10/1989 | Karstensen et al. | D329,693 S | 9/1992 | Arvanitakis et al. |
| 4,873,566 A | 10/1989 | Hokanson et al. | 5,146,078 A | 9/1992 | Luryi |
| 4,875,752 A | 10/1989 | Suzuki | D330,006 S | 10/1992 | Kamakura et al. |
| 4,881,789 A | 11/1989 | Levinson | 5,155,784 A | 10/1992 | Knott |
| 4,897,711 A | 1/1990 | Blonder et al. | 5,155,785 A | 10/1992 | Holland et al. |
| 4,903,340 A | 2/1990 | Sorensen | 5,155,786 A | 10/1992 | Ecker et al. |
| 4,911,519 A | 3/1990 | Burton et al. | 5,159,190 A | 10/1992 | Hohberg et al. |
| 4,912,521 A | 3/1990 | Almquist et al. | 5,163,109 A | 11/1992 | Okugawa et al. |

| | | |
|---|---|---|
| 5,168,537 A | 12/1992 | Rajasekharan et al. |
| D333,122 S | 2/1993 | Kamakura et al. |
| 5,193,099 A | 3/1993 | Chou |
| 5,195,155 A | 3/1993 | Shimaoka et al. |
| 5,199,093 A | 3/1993 | Longhurst |
| 5,201,018 A | 4/1993 | Coden et al. |
| 5,202,943 A | 4/1993 | Carden et al. |
| 5,206,766 A | 4/1993 | Bassett et al. |
| 5,212,754 A | 5/1993 | Basavanhally et al. |
| 5,212,761 A | 5/1993 | Petrunia |
| 5,216,737 A | 6/1993 | Driessen et al. |
| 5,233,676 A | 8/1993 | Yonemura et al. |
| 5,241,614 A | 8/1993 | Ecker et al. |
| 5,243,678 A | 9/1993 | Schaffer et al. |
| 5,247,530 A | 9/1993 | Shigeno et al. |
| 5,253,320 A | 10/1993 | Takahashi et al. |
| 5,259,052 A | 11/1993 | Briggs et al. |
| 5,259,053 A | 11/1993 | Schaffer et al. |
| 5,259,054 A | 11/1993 | Benzoni et al. |
| 5,271,079 A | 12/1993 | Levinson |
| 5,276,756 A | 1/1994 | Chambers et al. |
| 5,280,191 A | 1/1994 | Chang |
| 5,283,680 A | 2/1994 | Okugawa et al. |
| 5,283,802 A | 2/1994 | Hsiung |
| 5,285,511 A | 2/1994 | Akkapeddi et al. |
| 5,285,512 A | 2/1994 | Duncan et al. |
| 5,289,345 A | 2/1994 | Corradetti et al. |
| 5,295,214 A | 3/1994 | Card et al. |
| 5,325,454 A | 6/1994 | Rittle et al. |
| 5,325,455 A | 6/1994 | Henson et al. |
| 5,329,428 A | 7/1994 | Block et al. |
| 5,329,604 A | 7/1994 | Baldwin et al. |
| 5,333,221 A | 7/1994 | Briggs et al. |
| 5,333,225 A | 7/1994 | Jacobowitz et al. |
| 5,337,391 A | 8/1994 | Lebby |
| 5,337,396 A | 8/1994 | Chen et al. |
| 5,337,398 A | 8/1994 | Benzoni et al. |
| 5,345,524 A | 9/1994 | Lebby et al. |
| 5,345,530 A | 9/1994 | Lebby et al. |
| 5,347,604 A | 9/1994 | Go et al. |
| 5,353,364 A | 10/1994 | Kurashima |
| 5,361,244 A | 11/1994 | Nakamura et al. |
| 5,361,318 A | 11/1994 | Go et al. |
| D353,796 S | 12/1994 | Oliver et al. |
| 5,371,822 A | 12/1994 | Horwitz et al. |
| D354,271 S | 1/1995 | Speiser et al. |
| 5,408,559 A * | 4/1995 | Takahashi et al. ............ 385/89 |
| 5,412,497 A | 5/1995 | Kaetsu et al. |
| 5,414,787 A | 5/1995 | Kurata |
| 5,416,668 A | 5/1995 | Benzoni |
| 5,416,869 A | 5/1995 | Yoshino |
| 5,416,870 A | 5/1995 | Chun et al. |
| 5,416,871 A | 5/1995 | Takahashi et al. |
| 5,416,872 A | 5/1995 | Sizer, II et al. |
| 5,428,704 A | 6/1995 | Lebby et al. |
| 5,432,630 A | 7/1995 | Lebby et al. |
| 5,434,747 A | 7/1995 | Shibata |
| 5,436,997 A | 7/1995 | Makiuchi et al. |
| 5,440,658 A | 8/1995 | Savage, Jr. |
| 5,442,726 A | 8/1995 | Howard et al. |
| 5,446,814 A | 8/1995 | Kuo et al. |
| 5,452,387 A | 9/1995 | Chun et al. |
| 5,452,388 A | 9/1995 | Rittle et al. |
| 5,455,703 A | 10/1995 | Duncan et al. |
| 5,469,526 A | 11/1995 | Rawlings |
| 5,473,715 A | 12/1995 | Schofield et al. |
| 5,475,783 A | 12/1995 | Kurashima |
| 5,479,288 A | 12/1995 | Ishizuka et al. |
| 5,482,658 A | 1/1996 | Lebby et al. |
| 5,499,311 A | 3/1996 | DeCusatis |
| 5,499,312 A | 3/1996 | Hahn et al. |
| 5,511,140 A | 4/1996 | Cina et al. |
| 5,515,200 A | 5/1996 | Delrosso et al. |
| 5,515,468 A | 5/1996 | DeAndrea et al. ............ 385/88 |
| 5,526,160 A | 6/1996 | Watanabe et al. |
| 5,528,408 A | 6/1996 | McGinley et al. |
| 5,535,296 A | 7/1996 | Uchida |
| 5,537,504 A | 7/1996 | Cina et al. |
| 5,546,281 A | 8/1996 | Poplawski et al. |
| 5,548,676 A | 8/1996 | Savage, Jr. |
| 5,548,677 A | 8/1996 | Kakii et al. |
| 5,550,941 A | 8/1996 | Lebby et al. |
| 5,555,333 A | 9/1996 | Kato |
| 5,561,727 A | 10/1996 | Akita et al. |
| 5,596,663 A | 1/1997 | Ishibashi et al. |
| 5,604,831 A | 2/1997 | Dittman et al. |
| 5,631,989 A | 5/1997 | Koren et al. |
| 5,636,298 A | 6/1997 | Jiang et al. |
| 5,640,407 A | 6/1997 | Freyman et al. |
| 5,659,641 A | 8/1997 | DeMeritt et al. |
| 5,687,267 A | 11/1997 | Uchida |
| 5,698,849 A | 12/1997 | Figueria, Jr. |
| D389,123 S | 1/1998 | Vernon |
| D389,802 S | 1/1998 | Vernon |
| 5,708,743 A | 1/1998 | DeAndrea et al. |
| 5,717,533 A | 2/1998 | Poplawski et al. |
| 5,732,176 A | 3/1998 | Savage, Jr. |
| 5,734,558 A | 3/1998 | Poplawski et al. |
| 5,736,782 A | 4/1998 | Schairer |
| 5,738,538 A | 4/1998 | Bruch et al. |
| 5,751,471 A | 5/1998 | Chen et al. |
| 5,757,998 A | 5/1998 | Thatcher et al. |
| 5,761,229 A | 6/1998 | Baldwin et al. |
| 5,767,999 A | 6/1998 | Kayner |
| 5,774,614 A | 6/1998 | Gilliland et al. |
| D396,210 S | 7/1998 | Shiga et al. |
| 5,778,127 A | 7/1998 | Gilliland et al. |
| 5,812,582 A | 9/1998 | Gilliland et al. |
| 5,812,717 A | 9/1998 | Gilliland |
| 5,815,623 A | 9/1998 | Gilliland et al. |
| 5,864,468 A | 1/1999 | Poplawski et al. |
| 5,879,173 A | 3/1999 | Poplawski et al. |
| 5,896,480 A | 4/1999 | Scharf et al. |
| 5,898,812 A | 4/1999 | Vanoli |
| 5,901,263 A | 5/1999 | Giao et al. |
| 5,913,002 A | 6/1999 | Jiang |
| 6,024,500 A * | 2/2000 | Wolf ............................ 385/92 |
| 6,047,172 A | 4/2000 | Babineau et al. |
| 6,059,463 A | 5/2000 | Althaus et al. |
| 6,061,493 A | 5/2000 | Gilliland et al. |
| 6,062,893 A | 5/2000 | Miskin et al. |
| 6,071,017 A | 6/2000 | Gilliland et al. |
| 6,072,613 A | 6/2000 | Henningsson et al. |
| 6,085,006 A | 7/2000 | Gaio et al. |
| RE63,820 | 8/2000 | McGinley et al. |
| 6,120,191 A | 9/2000 | Asakura et al. |
| 6,142,680 A * | 11/2000 | Kikuchi et al. ................ 385/93 |
| 6,142,802 A | 11/2000 | Berg et al. |
| 6,200,041 B1 | 3/2001 | Gaio et al. |
| 6,201,704 B1 | 3/2001 | Poplawski et al. |
| 6,206,582 B1 | 3/2001 | Gilliland |
| 6,213,651 B1 * | 4/2001 | Jiang et al. ................... 385/92 |
| 6,220,878 B1 | 4/2001 | Poplawski et al. |
| 6,241,534 B1 | 6/2001 | Neer et al. |
| 6,267,606 B1 | 7/2001 | Poplawski et al. |
| D446,501 S | 8/2001 | Donnell et al. |
| 6,282,000 B1 | 8/2001 | Kikuchi et al. |
| 6,335,869 B1 | 1/2002 | Branch et al. |
| 6,341,899 B1 | 1/2002 | Shirakawa et al. |
| 6,369,924 B1 * | 4/2002 | Scharf et al. ................ 398/117 |
| 6,457,875 B1 * | 10/2002 | Kropp et al. .................. 385/89 |

OTHER PUBLICATIONS

R.G. Hunsperger; Integrated Optics: Theory and Technology (2nd Ed.); (1985); pp. 89–106; 236–245; Springer–Verlag Berlin Heidelberg; Germany.

A. Chatak and K. Thyagarajan; Introduction to Fiber Optics; (1998); pp. 411–413; 447–449; 467–473; Cambridge University Press: United Kingdom.

R.C. Dorf; Electrical Engineering Handbook; (1993) pp. 1682–1684; CRC Press, Inc.Florida.

Buczynski, et al., Fast Optical Thresholding with an Array of Optoelectronic Transceiver Elements, IEEE Photonics Technology Letters, vol. 11, No. 3, Mar. 1999.

Heinrich, et al., Low–Cost VCSEL–Transceiver Module for Optical Data Busses, IEEE, 1997.

Rosinski, et al., Multichannel Transmission of a Multicore Fiber Coupled with Vertical–Cavity Surface–Emitting Lasers, Journal of Lightwave Tech., vol. 17, No. 5, May 1999.

Crow, et al., The Jitney Parallel Optical Interconnect, 1996 Electronic Components and Technology Conference.

Shinichi Sasaki, et al., A Compact Optical Active Connector: An Optical Interconnect Module with an Electrical Connector Interface, IEEE vol. 22, No. 4, Nov. 1999.

* cited by examiner

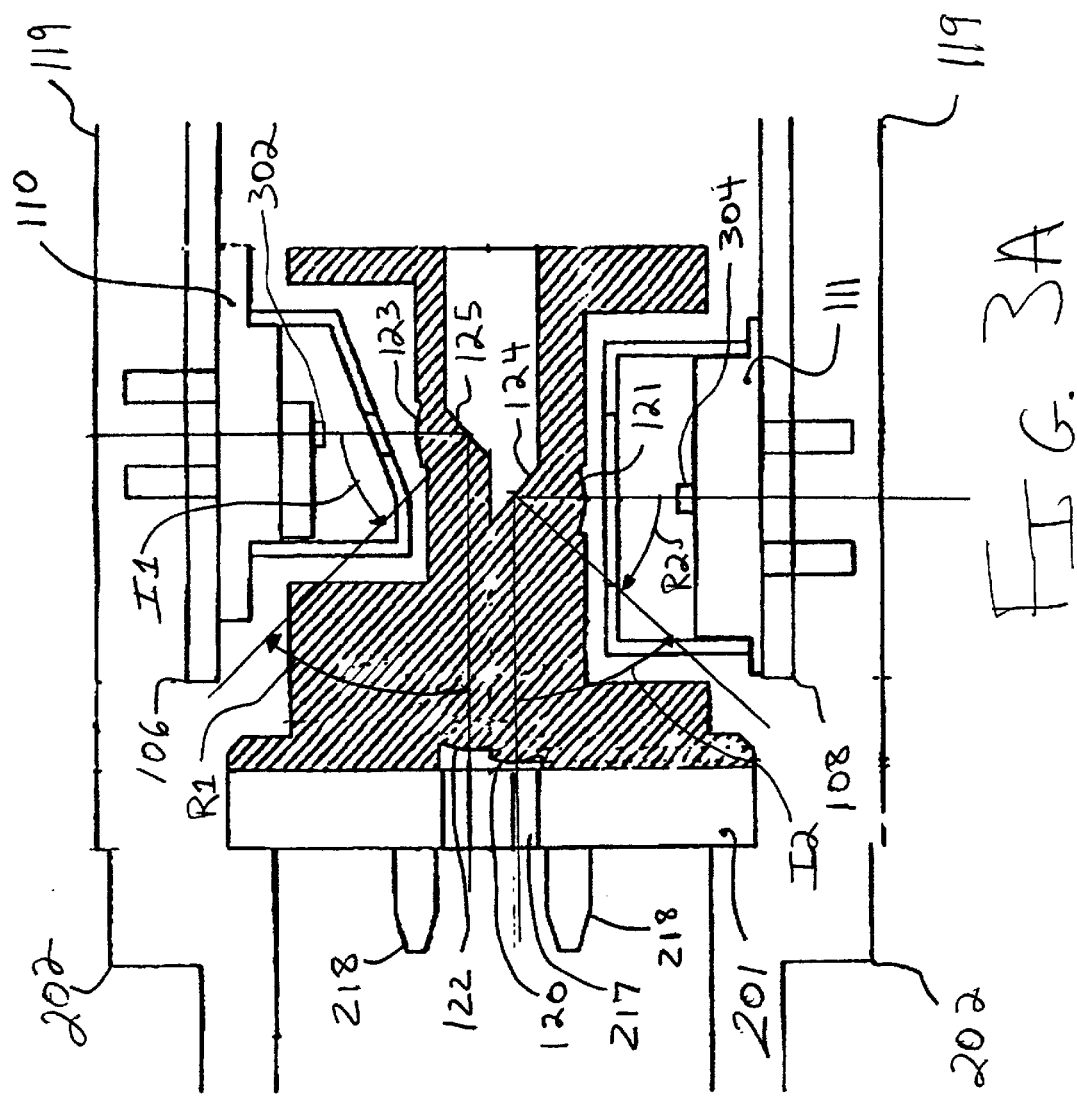

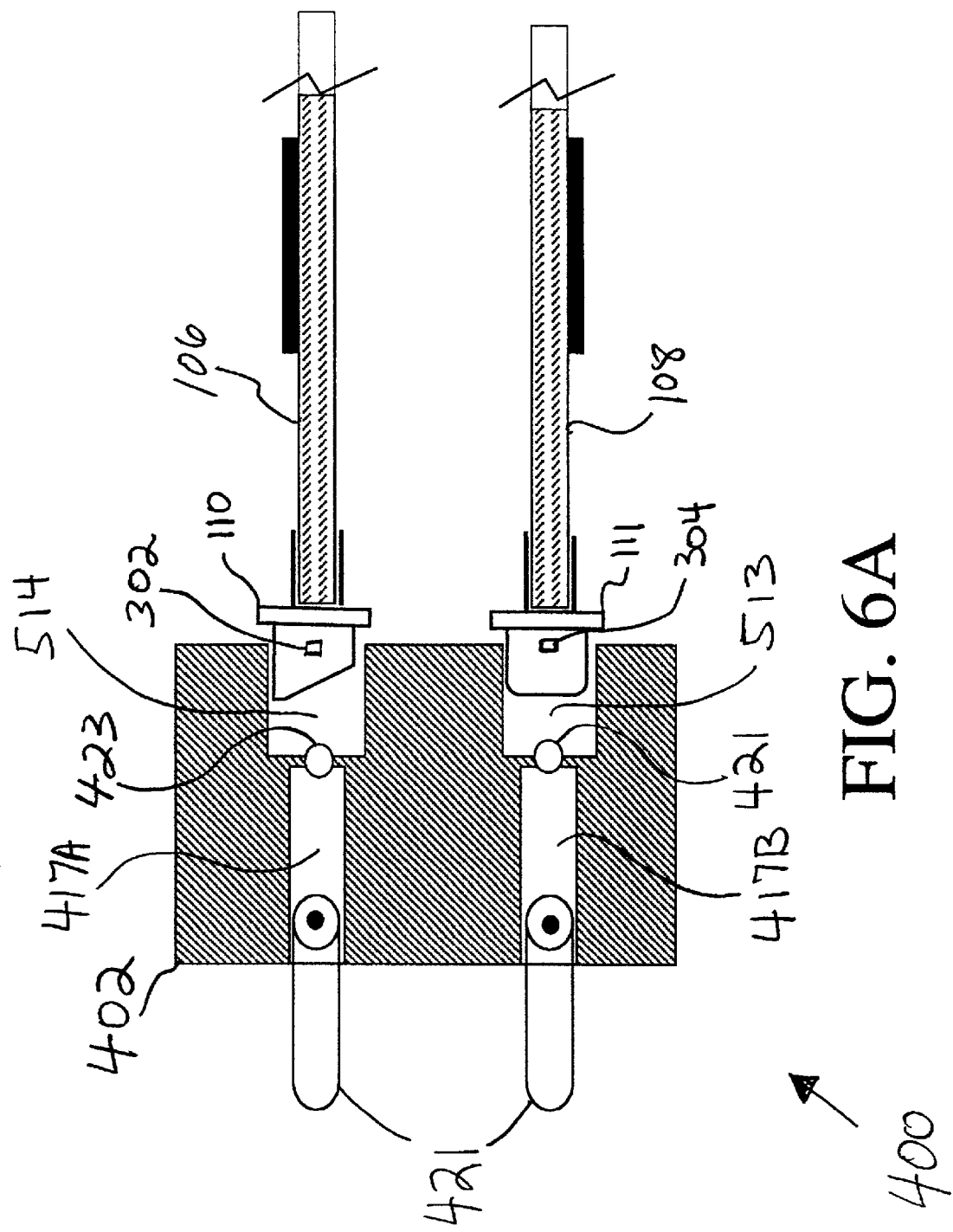

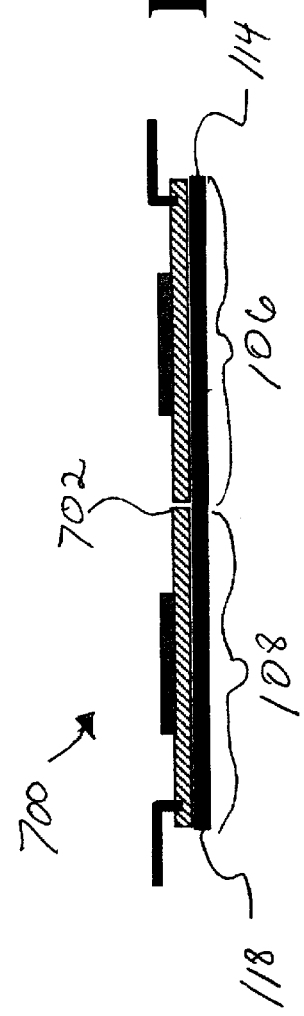
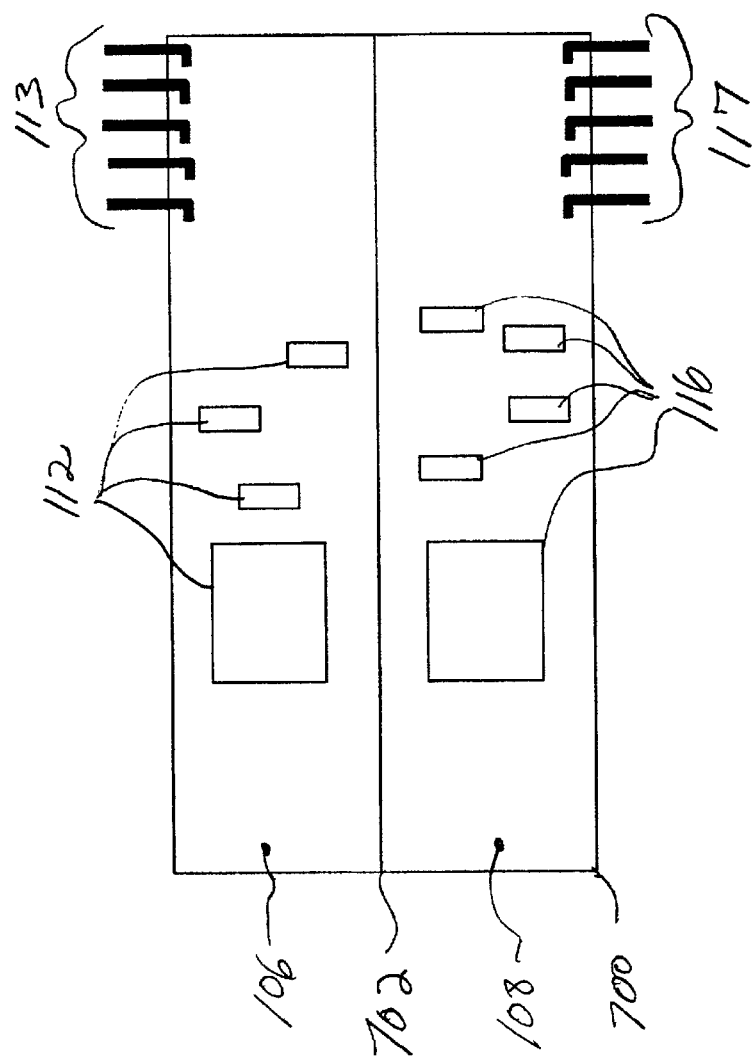
FIG. 7A
FIG. 7B

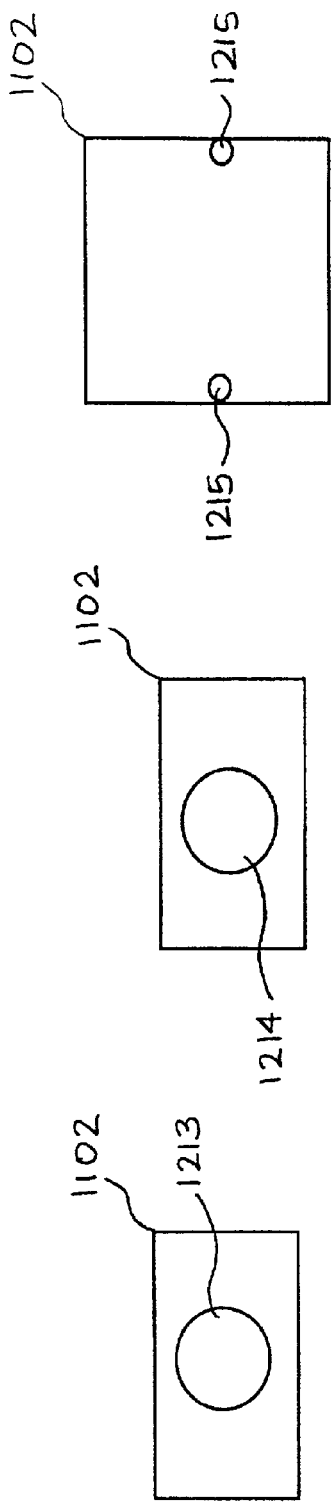

METHOD AND APPARATUS FOR IMPROVED OPTICAL ELEMENTS FOR VERTICAL PCB FIBER OPTIC MODULES

CROSS REFERENCE TO RELATED APPLICATION

This application is related to U.S. patent application Ser. No. 09/320,409, filed May 26, 1999 by inventors Wenbin Jiang et al, entitled "METHOD AND APPARATUS FOR VERTICAL CONSTRUCTION OF FIBER OPTIC TRANSMITTERS, RECEIVERS AND TRANSCEIVERS", now issued as U.S. Pat. No. 6,213,651 B1, the disclosure of which is hereby incorporated by reference, verbatim and with the same effect as though it were fully and completely set forth herein.

FIELD OF THE INVENTION

This invention relates generally to light bending devices. More particularly, the invention relates to fiber optic modules.

BACKGROUND OF THE INVENTION

Fiber optic modules interface optical fibers to electronic circuitry transducing communication by light or photons with communication by electrical signals. A fiber optic module may be a fiber optic receiver, transmitter or transceiver including both receive and transmit functions. The fiber optic receiver, transmitter and transceiver each have optical elements (OE) and electrical elements (EE). The fiber optic transmitter OE includes an emitter (such as a semiconductor LED or Laser) mounted in a package and an optical coupling element for coupling light or photons from the OE into the optical fiber. The type of semiconductor laser (light amplification by stimulated emission of radiation) may be a vertical cavity surface emitting laser (VCSEL). The fiber optic receiver OE includes a photodetector (such as a photodiode) mounted in a package and an optical coupling element for coupling light or photons from the optical fiber into the photodetector. The EE for each includes integrated circuits and passive elements mounted on a substrate such as a printed circuit board (PCB) or ceramic. The OE and EE are connected electrically at the emitter and photodetector.

Because of the high transmission frequencies utilized in fiber optic communication, crosstalk between receive and transmit signals is of concern. Additionally, electromagnetic interference (EMI) is of concern due to the high frequency of operation of the fiber optic modules. In order to reduce EMI, shielding of the electrical components is required which is usually accomplished by attaching a metal shield to the substrate of the fiber optic module and connecting it to ground. In order to avoid electronic crosstalk and EMI, the fiber optic transceiver usually employs separate components and separate shielding of fiber optic receiver and fiber optic transmitter components. In order to avoid optical crosstalk where light or photons can interfere between communication channels, the fiber optic transceiver usually employs separate optical elements for coupling light or photons into and out of the optical fiber for fiber optic receiver and fiber optic transmitter. Using separate optical elements requires additional components and increases the costs of fiber optic transceivers. It is desirable to reduce the component count of fiber optic transceivers such that they are less expensive to manufacture.

The form factor or size of the fiber optic module is of concern. Previously, the fiber optic transceiver, receiver, and transmitter utilized horizontal boards or substrates which mounted parallel with a system printed circuit board utilized significant footprint or board space. The horizontal boards provided nearly zero optical crosstalk and minimal electronic crosstalk when properly shielded. However, the horizontal boards, parallel to the system printed circuit board, required large spacing between optical fiber connectors to make the connection to the optical fibers. While this may have been satisfactory for early systems using minimal fiber optic communication, the trend is towards greater usage of fiber optic communication requiring improved connectivity and smaller optical fiber connectors to more densely pack them on a system printed circuit board. Thus, it is desirable to minimize the size of system printed circuit boards (PCBs) and accordingly it is desirable to reduce the footprint of the fiber optic module which will attach to such system PCBs. Additionally, the desire for tighter interconnect leads of fiber optic cables, restricts the size of the OE's. For example, in the common implementation using TO header and can, the header dimension of the interconnect lead is normally 5.6 mm. In small form factor optical modules, such as the MT family, the two optical fibers are separated by a distance of only 0.75 mm. This severely restricts the method of coupling light or photons from the OE into and out of fiber optic cables.

There are a number of types of fiber optic cables available. The types of fiber optic cables can vary by the mode or the frequencies supported (single or multimode), the diameter of the fiber, the type of index of refraction (graded, stepped, uniform, etc.), and other factors. Often times the received light from an optical fiber is nonuniform making the alignment between optical fiber and an optical element more critical. Additionally, the light output from a light transmitter is often a single mode or only having a couple modes and it is desirable to excite multiple modes in a multimode optical fiber. When multiple modes are coupled into a multimode fiber, photons propagate at different speeds in the fiber. Such a difference in speed causes an effect known as the differential mode delay (DMD) phenomenon in multimode optical fibers which can reduce the optical transmission distance within an optical fiber. To overcome this phenomenon, the beam is ordinarily off-center launched into the fiber to excite only higher order modes of the fiber. Fewer modes in the fiber will reduce the DMD effect. However, such a launch technique increases alignment difficulty in the assembly, and thus the cost of the module. It is therefore desirable to have a single design that can couple light into or receive light from various diameters of optical fibers with better alignment tolerance. Thus, it is desirable to improve the OEs of fiber optic modules for coupling or launching light into various fiber optic cables and for receiving light from various fiber optic cables.

BRIEF SUMMARY OF THE INVENTION

Briefly, the present invention includes a method, apparatus and system for improved optical elements for vertical PCB fiber optic modules as described in the claims. Fiber optic transmitter and receiver electrical elements are implemented on two separate substantially parallel boards in a fiber optic transceiver modules. The parallel boards are mount substantially perpendicular to the base of the fiber optic module and the system printed circuit board to which it attaches, to reduce the footprint of the fiber optic module. In one embodiment, bending light or photons through ninety degrees, the light transmitter (a packaged type of emitter) and a light receiver (a packaged type of photodetector) are each mounted substantially perpendicular to the transmit and receive boards respectively such that their active areas are nearly facing each other but offset. A single optical block implements lenses and reflecting surfaces to minimize manufacturing costs. The light receiver and light transmitter are mounted offset from each other in the optical block in order to avoid optical cross talk. In a second embodiment, the light transmitter (emitter) and the light receiver (photodetector) are each mounted substantially parallel with the transmit and receive boards respectively and the connection to the optical fibers. The separate and substantially parallel receive and transmit boards are provided with ground planes on back sides in order to minimize electrical cross talk. A module outer shielded housing, manufactured out of metal or metal plated plastic, provides further shielding for EMI. The substantially parallel boards may be extended to support multiple channels or multiple parallel fibers such as in a ribbon optical fiber cable. Manufacturing steps of the boards for the fiber optic module are disclosed to provide reduced manufacturing costs.

In a third embodiment of the present invention, the light receiver and light transmitter are coupled to the receive board and transmit boards on an angle facing towards the optical fibers. The receiver and transmitter can be mounted directly across from each other without any offset in position because they do not face each other but are coupled at an angle and can avoid optical cross talk. A single optical block can provide the lenses and reflecting surfaces to minimize manufacturing costs. The reflecting surface for the transmitter may include a beam shaper to uniformly mix the spatial modes and increase the beam size to reduce the beam alignment sensitivity for coupling the light into the fiber, such that passive alignment need only be used. The beam shaper furthermore improves the launching of light or photons into a multimode optical fiber to stimulate other modes such that differential mode delay effect and modal noise is reduced. The separate and substantially parallel receive and transmit boards are provided with ground planes on back sides facing each other in order to minimize electrical cross talk. A module outer shielded housing, manufactured out of metal or metal plated plastic, provides further shielding for EMI.

In a fourth embodiment of the present invention, the light receiver and light transmitter are coupled to the receive board and transmit boards on an angle facing away from the optical fibers. The receiver and transmitter can be mounted directly across from each other without any offset in position because they do not face each other but are coupled at an angle and can avoid optical cross talk. A single optical block can provide the lenses and reflecting surfaces to minimize manufacturing costs. The reflecting surface for the transmitter may include a beam shaper to uniformly mix the spatial modes and the beam size to decrease the alignment sensitivity of the transmitter, such that passive alignment need only be used. The beam shaper furthermore improves the launching of light or photons into a multimode optical fiber to stimulate other modes such that differential mode delay effect is reduced. The separate and substantially parallel receive and transmit boards are provided with ground planes on back sides in order to minimize electrical cross talk. A module outer shielded housing, manufactured out of metal or metal plated plastic, provides further shielding for EMI.

BRIEF DESCRIPTIONS OF THE DRAWINGS

FIG. 3I is a magnified cross-sectional view of the alignment post of the optic block.

FIG. 6A is a cross-sectional view from the top of the optic block for the second embodiment of the present invention.

FIG. 7A is a top view of a manufacturing step of the present invention.

FIG. 7B is a side view of a manufacturing step of the present invention.

FIG. 13B is a right side view of the optic block for the fourth embodiment of the present invention.

FIG. 13C is a left side view of the optic block for the fourth embodiment of the present invention.

FIG. 13D is a top side view of the optic block for the fourth embodiment of the present invention.

DETAILED DESCRIPTION OF THE PREFERRED EMBODIMENT

Figure 1:
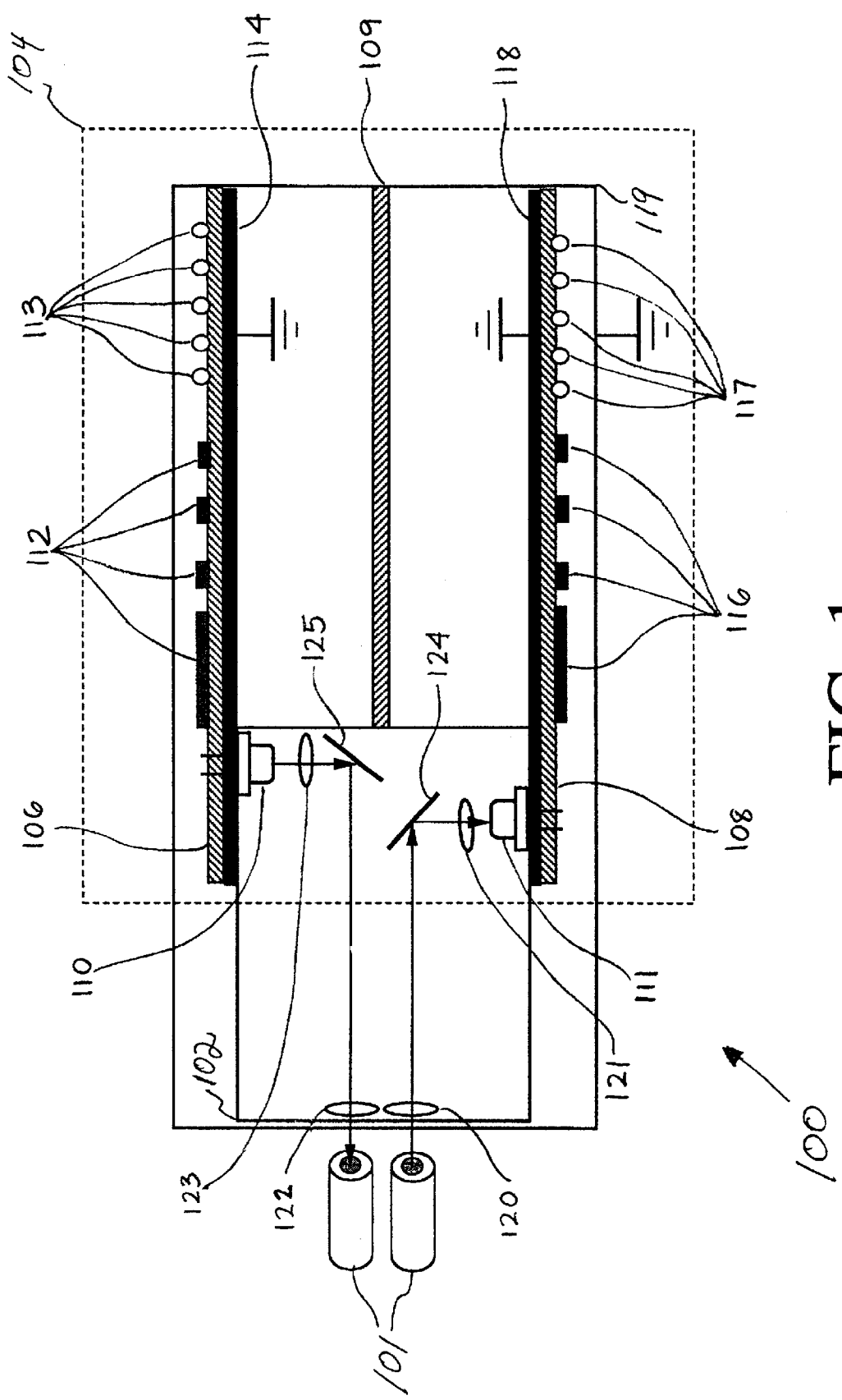
FIG. 1 is a simplified top cutaway view of a first embodiment of the present invention.

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The present invention includes a method, apparatus and system for improved optical elements for vertical PCB fiber optic modules. Briefly, fiber optic transmitter and receiver electrical elements are implemented on two separate substantially parallel boards in a fiber optic transceiver modules. The parallel boards are mounted substantially perpendicular to the base of the fiber optic module and the system printed circuit board to which it attaches, to reduce the footprint of the fiber optic module. In one embodiment, bending light or photons through ninety degrees, the light transmitter (a packaged type of emitter) and a light receiver (a packaged type of photodetector) are each mounted substantially perpendicular to the transmit and receive boards respectively such that their active areas are nearly facing each other but offset. A single optical block implements lenses and reflecting surfaces to minimize manufacturing costs. The light receiver and light transmitter are mounted offset from each other in the optical block in order to avoid optical cross talk. In a second embodiment, the light transmitter (emitter) and the light receiver (photodetector) are each mounted substantially parallel with the transmit and receive boards respectively and the connection to the optical fibers. The separate and substantially parallel receive and transmit boards are provided with ground planes on back sides in order to minimize electrical cross talk. Preferably the ground planes on the back sides of the printed circuit boards face each other. A module outer shielded housing, manufactured out of metal or metal plated plastic, provides further shielding for EMI. The substantially parallel boards may be extended to support multiple channels or multiple parallel fibers such as in a ribbon optical fiber cable. Manufacturing steps of the boards for the fiber optic module are disclosed to provide reduced manufacturing costs.

In a third embodiment of the present invention, the light receiver and light transmitter are coupled to the receive board and transmit boards on an angle facing towards the optical fibers. The receiver and transmitter can be mounted directly across from each other without any offset in position because they do not face each other but are coupled at an angle and can avoid optical cross talk. A single optical block can provide the lenses and reflecting surfaces to minimize manufacturing costs. The reflecting surface for transmission may include a beam shaper to mix the spatial modes uniformly and to reduce beam alignment sensitivity for coupling the light into the fiber, such that passive alignment need only be used. The beam shaper furthermore improves the launching of light or photons into a multimode optical fiber to stimulate other modes such that differential mode delay effect and modal noise is reduced. The separate and substantially parallel receive and transmit boards are provided with ground planes on back sides facing each other in order to minimize electrical cross talk. A module outer shielded housing, manufactured out of metal or metal plated plastic, provides further shielding for EMI.

In a fourth embodiment of the present invention, the light receiver and light transmitter are coupled to the receive board and transmit boards on an angle facing away from the optical fibers. The receiver and transmitter can be mounted directly across from each other without any offset in position because they do not face each other but are coupled at an angle and can avoid optical cross talk. A single optical block can provide the lenses and reflecting surfaces to minimize manufacturing costs. The reflecting surface for the transmitter may include a beam shaper to uniformly mix the spatial modes and increase the beam size to decrease the alignment sensitivity of coupling light into the fiber, such that passive alignment need only be used. The beam shaper furthermore improves the launching of light or photons into a multimode optical fiber to stimulate other modes such that differential mode delay effect and modal noise are reduced. The separate and substantially parallel receive and transmit boards are provided with ground planes on back sides facing each other in order to minimize electrical cross talk. A module outer shielded housing, manufactured out of metal or metal plated plastic, provides further shielding for EMI.

Referring now to FIG. 1, a simplified cutaway view of the first embodiment of the present invention is illustrated. FIG. 1 illustrates a fiber optic module 100 coupling to a pair of fiber optic cables 101. Fiber optic module 100 includes an optical block 102 and an electrical element 104. The electrical element 104 includes a transmit printed circuit board (PCB) 106, a receive PCB 108, an optional internal shield 109, a light transmitter 110, a light receiver 111, and a shielded housing 119. The light transmitter 110 and light receiver 111 are optoelectronic devices for communicating with optical fibers using light of various wavelengths or photons. An optoelectronic device is a device which can convert or transduce light or photons into an electrical signal or an electrical signal into light or photons. The transmitter 110 is a packaged emitter, that converts an electrical signal into emitting light or photons, such as a semiconductor laser or LED, preferably packaged in a TO can. The receiver 111 is a packaged photodetector, that detects or receives light or photons and converts it into an electrical signal, such as a photo diode, preferably package in a TO can. However other packages, housings or optoelectronic devices for receiving and transmitting light or photon may be used for the receiver 111 or transmitter 110.

Each of the optoelectronic devices, receiver 111 and transmitter 110, have terminals to couple to thruholes of the PCBs 106 and 108. The transmit PCB 106 includes electrical components 112 (transmitter integrated circuit (laser driver), resistors, capacitors and other passive or active electrical components), pins 113, and a ground plane 114. The electrical components 112 control the transmitter 110 and buffer the data signal received from a system for transmission over an optical fiber. The receive PCB 108 includes electrical components 116 (receiver integrated circuit (transimpedance amplifier and post amplifier), resistors, capacitors and other passive or active electrical components), pins 117, and a ground plane 118. The electrical components 116 control the receiver 111 and buffer the data signal received from an optical fiber. The ground planes 114 and 118 and the shielded housing 119 are coupled to ground. The electrical components 116 and pins 117 are sandwiched between the ground plane 118 and the shielding 119 to shunt electromagnetic fields to ground and avoid crosstalk in the receive PCB 108. Electrical components 112 and pins 113 are sandwiched between the ground plane 114 and the shielded housing 119 to shunt electro-magnetic fields generated by these components to ground and avoid crosstalk in the transmit PCB 106. Optional internal shielding 109 further provides additional crosstalk protection between printed circuit boards. If ground planes 114 and 118 are not used, then internal shielding 109 is required to reduce the electromagnetic fields that may be generated.

The optical block 102 includes lenses 120–123 and reflectors 124–125. Lenses 120–123 may be any culminating lenses including aspheric lenses, ball lenses, and GRIN lenses. Lenses 121–123 may be symmetric (circular symmetry) or asymmetric to provide optical steering. Lens 123 is for collimating the light or photons diverging from the transmitter 110 and lens 122 is for focussing the collimated light or photons into an optical fiber. Lens 120 is for collimating the light or photons diverging out from the end of an optical fiber and lens 121 is for focusing the collimated light or photons into the receiver 111. Reflectors 124–125 may be facets formed in the optical block having angles to provide total internal reflection between the optical block material and the atmosphere. Preferably they are forty five degree angle facets. Alternatively, they may be facets coated with a reflective surface or mirror surface to reflect light or photons off the reflective coated surface or facets having an optical grating surface to reflect photons. The optical block 102 is constructed of a thermoplastic or polycarbonate which is clear to the desired wavelengths of light or photons. The reflectors 124–125, lenses 120–123 and other elements of the optical block 102 described below are formed through injection molding of the desired material.

Figure 2:
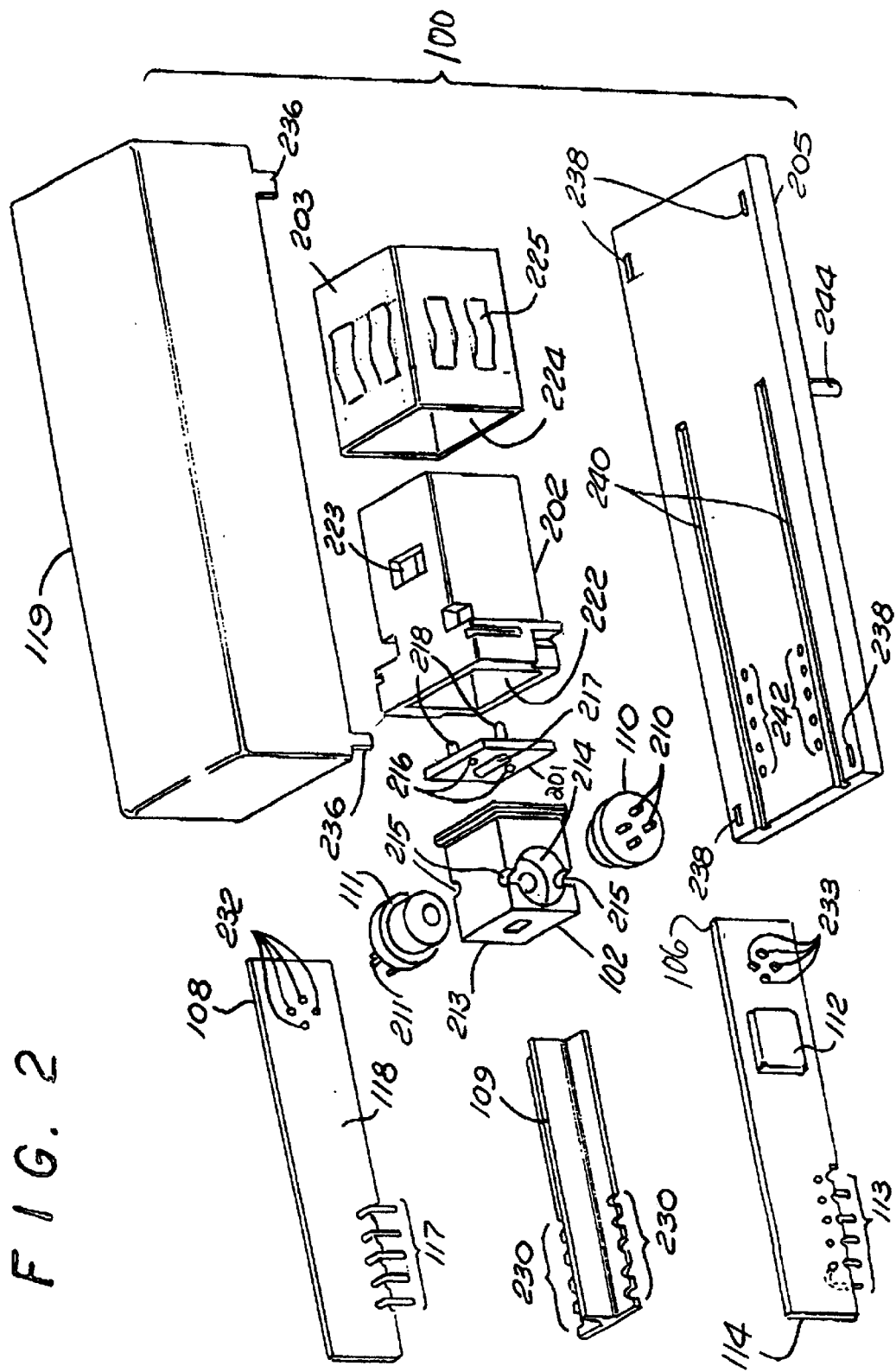
FIG. 2 is an exploded view of the first embodiment of the present invention.

Referring to FIG. 2, an exploded diagram of the fiber optic module 100 is illustrated and its assembly is described. Transmitter 110 is inserted into an opening 214 in the optical block 102. Receiver 111 is inserted into an opening 213 in optical block 102. An epoxy is injected into top and bottom tacking holes 215 in order to hold the transmitter 110 and receiver 111 in openings 214 and 213 respectively. An MT alignment plate 201 has optical block alignment holes 216, an optical opening 217 and fiber optic connector alignment pins 218 for alignment purposes. The optical block holes 216 couple to optical block alignment pins in the optical block 102, not illustrated in FIG. 2. The fiber optic connector alignment pins 218 are for aligning optical fibers that couple to the fiber optic module 100.

For coupling to a fiber optic connector, the fiber optic module 100 has a nose 202 and a nose shield 203. The nose 202 includes a optical fiber opening 222 and a latch opening 223. The latch opening 223 receives the optical fiber connector and holds the optical fiber substantially fixed in place and aligned with the optical opening 217 of the alignment plate 201. The nose shield 203 includes an opening 224 for insertion over the nose 202 and shield tabs 225 for coupling to the ground plane of the package. The nose shielding 203 further reduces EMI.

After assembling the nose pieces to the optical block 102, the transmitter 110 and receiver 111 may be aligned to provide optimal light or photon output and reception. Alignment of the transmitter 110 and receiver ill in optical block 102 is performed by active alignment where the receiver 111 and transmitter 110 are powered up to detect and emit photons. By moving them in and out by their headers, the receiver 111 and transmitter 110 are properly aligned in the optical block 102 to provide maximum photon detection from or coupling into fiber 101. The tacking holes 215 extend into the openings 213 and 214 such that epoxy may be poured in to hold the optoelectronic devices to the optical block. After alignment is complete, the epoxy is UV cured and allowed to set such that the receiver 111 and transmitter 110 are substantially coupled to the optical block 102.

After the epoxy has set, the receive PCB 108 and the transmit PCB 106 may be attached to the receiver 111 and transmitter 110 respectively. Receiver thruholes 232 in the receive PCB 108 are aligned and slid over terminals 211 of the receiver 111. The terminals 211 are then soldered to make an electrical connection on the component side (opposite the side of the ground plane 118) of the receive PCB 108. Transmitter thruholes 233 in the transmit PCB 106 are aligned and then slid over the terminals 210 of the transmitter 110. The terminals 210 are then soldered to make an electrical connection on the component side (opposite the side of the ground plane 114) of transmit PCB 106. Ground planes 114 and 118 have sufficient material removed around the transmitter thruholes 233 and the receiver thruholes 232 respectively to avoid shorting the terminals of the transmitter 110 and receiver 111 to ground.

After coupling the PCBs 108 and 106 to the receiver 111 and transmitter 110 respectively, the assembly is inserted into the shielded housing 119. The optional internal shield 109 is next assembled into the shielded housing 119 between the PCBs 106 and 108. The optional internal shield 109 has pin slots 230 to surround the pins 113 and 117 and avoid shorting thereto. The shielded housing 119 includes clips 236 at each corner for mating to a base 205. The base 205 includes PCB slots 240, clip openings 238 into which the clips 236 may be inserted, and base pin holes 242 into which the PCB pins 113 and 117 may be inserted. The base 205 includes a guide post 244 for mounting the fiber optic module into a system printed circuit board. The bottom of the base mounts parallel to the printed circuit board of the system such that when horizontal, the receive PCB 108 and the transmit PCB 106 are vertical and substantially perpendicular in reference to the printed circuit board of the system and the base 205. Next in assembly, the base 205 has its base pin holes 242 slid over the PCB pins 113 and 117, the printed circuit boards 106 and 108 are guided to mate with the PCB slots 240, and the clips 236 of the shielded housing 119 are guided into the clip openings 238. The receive PCB pins 113 and the transmit PCB pins 117 are vertical and substantially perpendicular in reference to the printed circuit board of the system and the base 205. After coupling the base 205 to the shielded housing 119, the clips 236 are bent, twisted, or otherwise changed in order to hold the base 205 in place. As an alternative to clips 236 and clip openings 238, the shielded housing 119 may use plastic clips, or a ridge, integrated into each side that couples to base 205 appropriately. The shielded housing 119, which is coupled to ground, encases the PCBs 106 and 108 to reduce the electromagnetic fields generated by the electrical components coupled thereto by shunting the electric fields to ground to reduce electromagnetic interference (EMI).

Figure 3A:
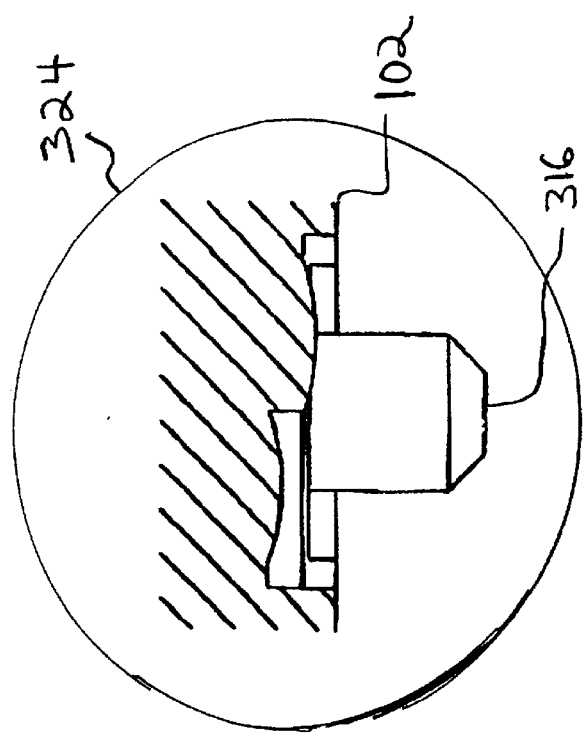
FIG. 3A is a cross-sectional view from the top of the optic block for the first embodiment of the present invention.

Referring now to FIG. 3A, a cross-sectional view of the optical block 102 for the first embodiment is illustrated. The transmitter 110, the receiver 111, and the MT alignment plate 201 are coupled to the optical block 102. The light transmitter 110 includes an emitter 302 for generation of light or photons in response to electrical signals from the transmit PCB 106. The light receiver 111 includes a detector 304 to receive light or photons and generate electrical signals in response to light or photons coupled thereto. Light or photons emitted by the emitter 302 are coupled into lens 123 and collimated onto the reflector 125 at an incident angle I1 (angle with the perpendicular to reflector 125 surface) of substantially forty five degrees. Reflector 125 reflects the incident light or photons on a refraction angle R1 (angle with the perpendicular to reflector 125 surface) equivalent to incident angle I1 of substantially forty five degrees. The reflected light or photons travel perpendicular to the incident light or photons towards the lens 122. Lens 122 focuses the light or photons from the emitter 302 into an aligned optical fiber through the optical port 217 in the MT alignment plate 201. Thus, light or photons coupled or launched into an optical fiber, defining a first optical axis, are substantially perpendicular to the light or photons emitted and incident upon lens 123 from the emitter 302 of the transmitter 110.

Light or photons, incident from a fiber optic cable coupled to the fiber optic module 100, is received through the optical port 217 of the MT alignment plate 201. Light or photons from the fiber optic cable are aligned to be incident upon the lens 120. Lens 120 collimates the incident light or photons from a fiber optic cable onto the reflector 124 at an incident angle I2 of substantially forty five degrees. Reflector 124 reflects incident light or photons at a refractive angle R2 equivalent to incident angle I2 of substantially forty five degrees towards lens 121. Lens 121 focuses the light or photons received from a fiber optical cable onto the detector 304. Light or photons incident from a fiber optic cable, defining a second optical axis, are substantially perpendicular to the light or photons incident upon the detector 304.

Figure 3B:
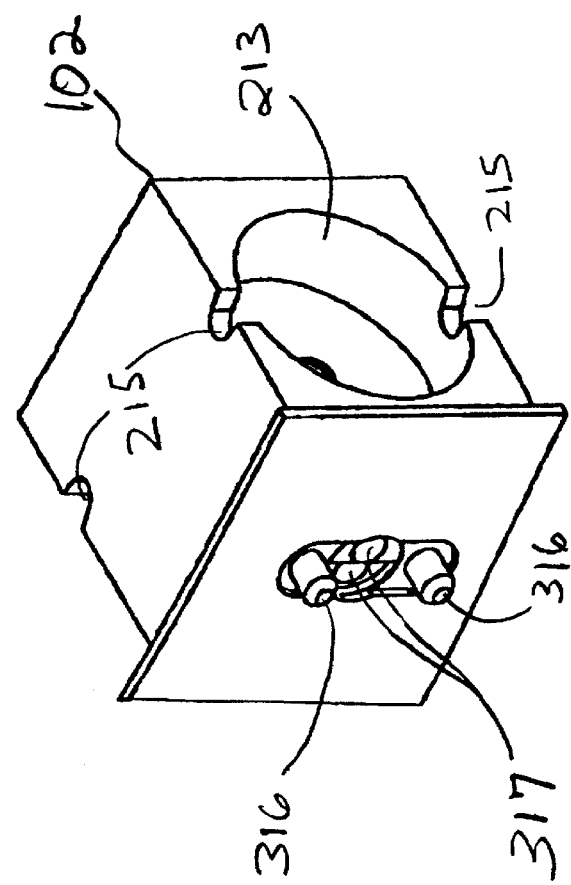
FIG. 3B is a front side perspective view from the left of the optic block for the first embodiment of the present invention.

FIG. 3B illustrates a frontal perspective view from the left side of the optical block 102. The front side of the optical block 102 includes optical block alignment pins 316 and an optical output opening 317. The optical block alignment pins 316 couple to the alignment holes 216 of the alignment plate 201 such that the optical output opening 317 is aligned with the optical port 217 in the alignment plate 201. FIG. 3C illustrates the front side of the optical block 102. The optical output opening 317 is indicated.

Figure 3F:
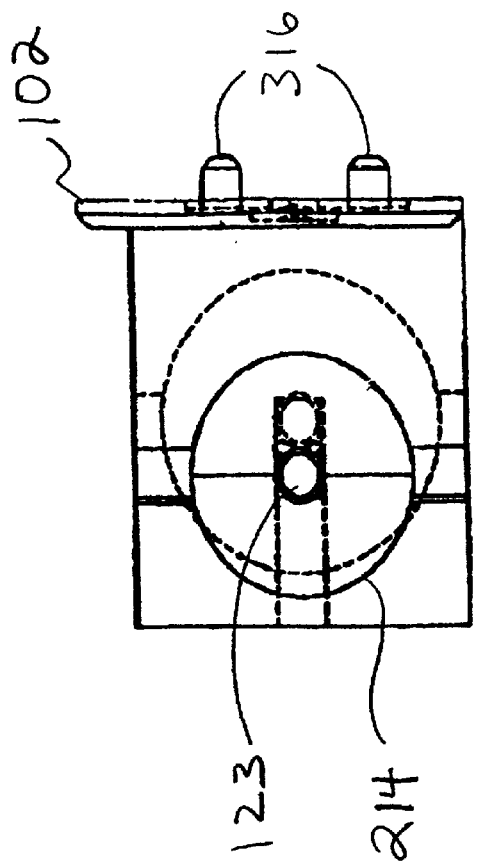
FIG. 3F is a right side view of the optic block for the first embodiment of the present invention.
Figure 3C:
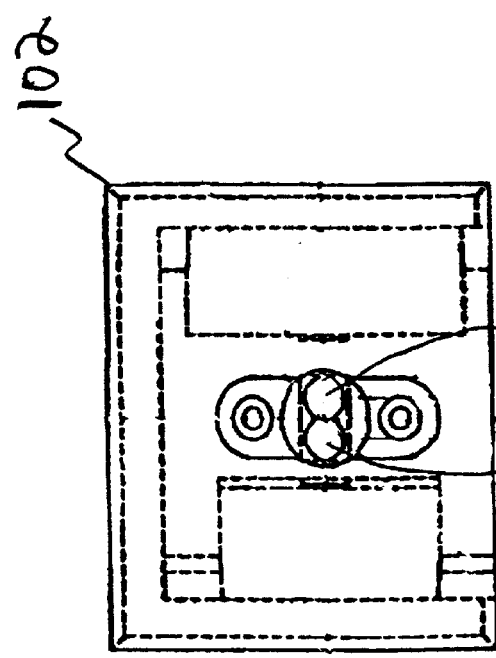
FIG. 3C is a frontal view of the optic block for the first embodiment of the present invention.
Figure 3H:
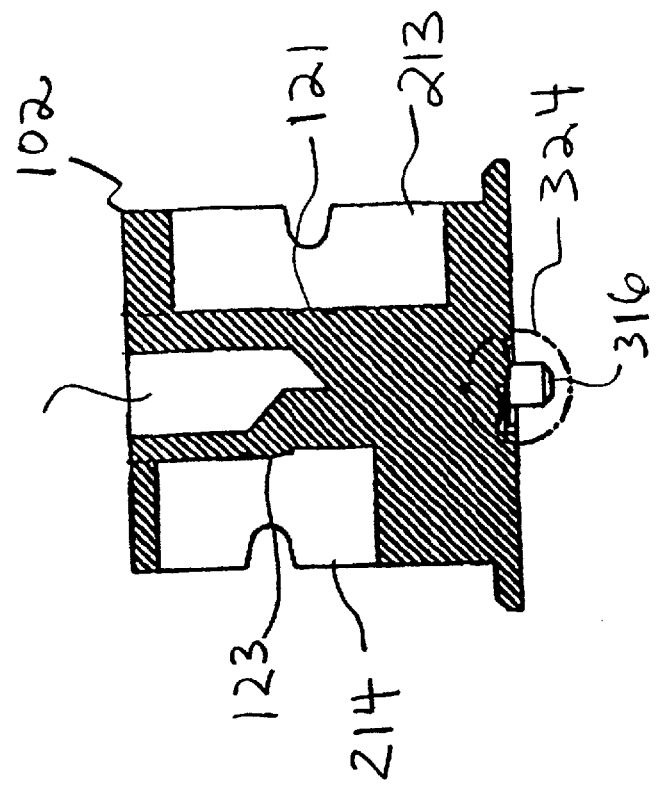
FIG. 3H is a cross-sectional view of the optic block for the first embodiment of the present invention.
Figure 3D:
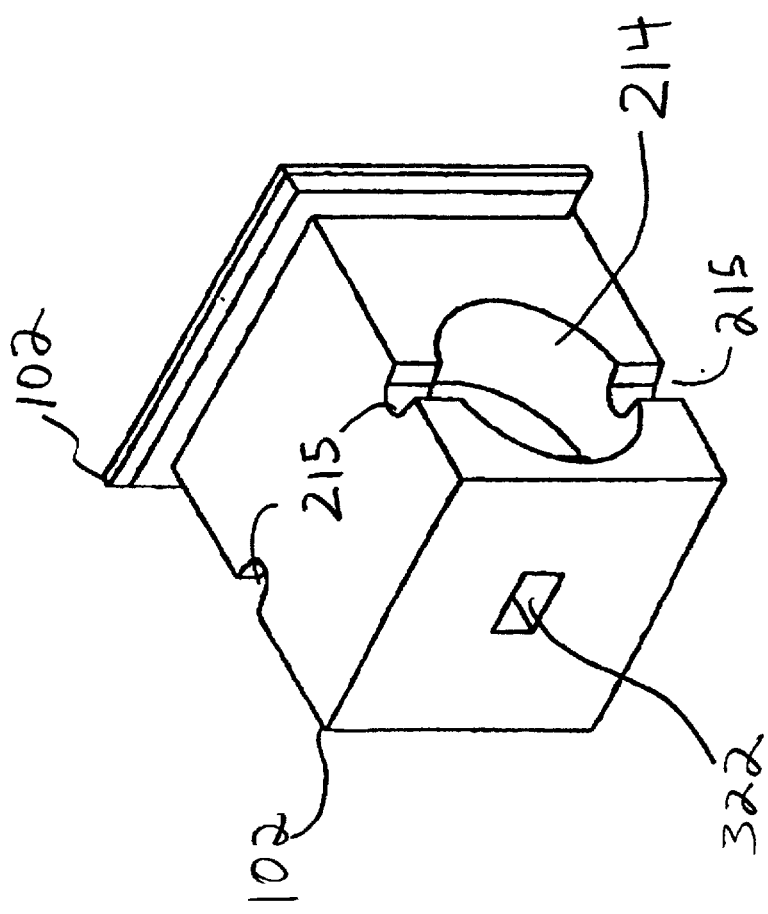
FIG. 3D is a back side perspective view from the right of the optic block for the first embodiment of the present invention.
Figure 3E:
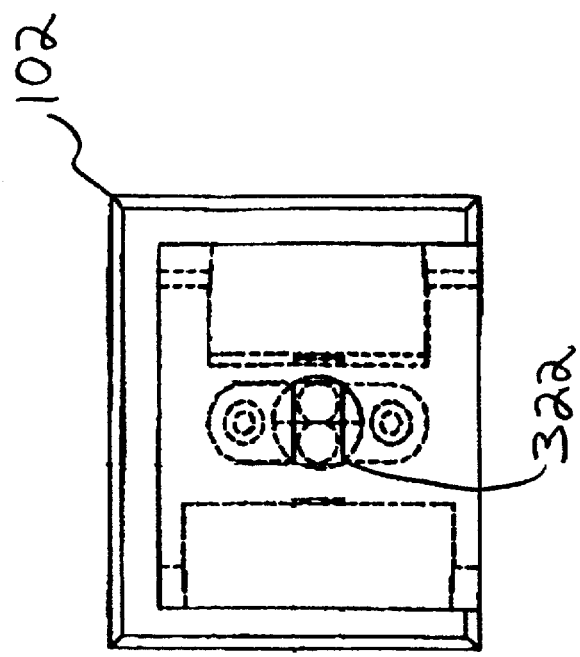
FIG. 3E is a back view of the optic block for the first embodiment of the present invention.

FIG. 3D is a back side perspective view from the right of the optical block 102. The back side of the optical block 102 includes a cavity 322 that is used to form the shape of the reflective surfaces 124–125 during manufacturing of the optical block 102. FIG. 3E is a back view of the optic block illustrating the opening into the cavity 322.

Figure 3G:
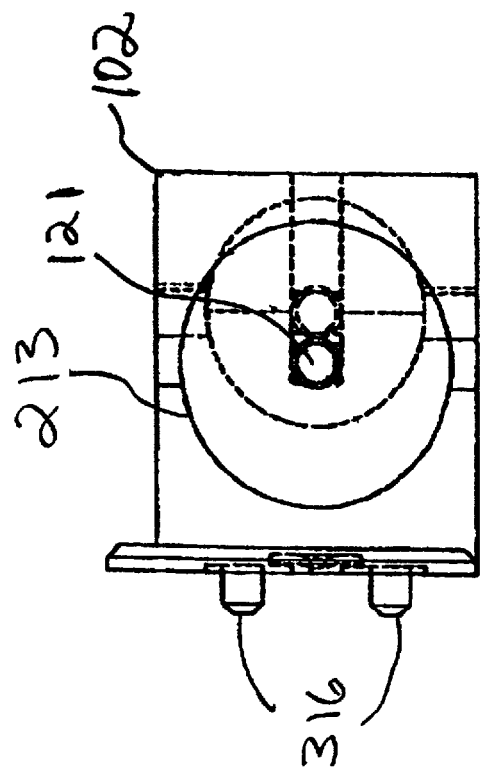
FIG. 3G is a left side view of the optic block for the first embodiment of the present invention.

FIG. 3F illustrates the right side of the optical block 102 which has the opening 214 to mate with the type of housing of the transmitter 110. The lens 123 can be viewed near the center of the opening 214. FIG. 3G illustrates the left side of the optical block 102, which has the opening 213 to mate with the type of housing of the receiver 111. The lens 121 can be viewed near the center of the opening 213. Comparing FIGS. 3F and 3G, the offset between openings 213 and 214 to avoid optical crosstalk is visible. In the preferred embodiment, receiver 111 is closer to the optical opening 317 in order to minimize the loss of incoming received optical power. However, the position of receiver 111 and transmitter 110 can be interchanged. FIG. 3H is a cross-sectional view of the optical block 102 illustrating the relative position of the optical block alignment posts 316. The area 324 surrounding the alignment post 316 is magnified in FIG. 3I. FIG. 3I provides a magnified cross-sectional view of the alignment post 316.

Figure 4:
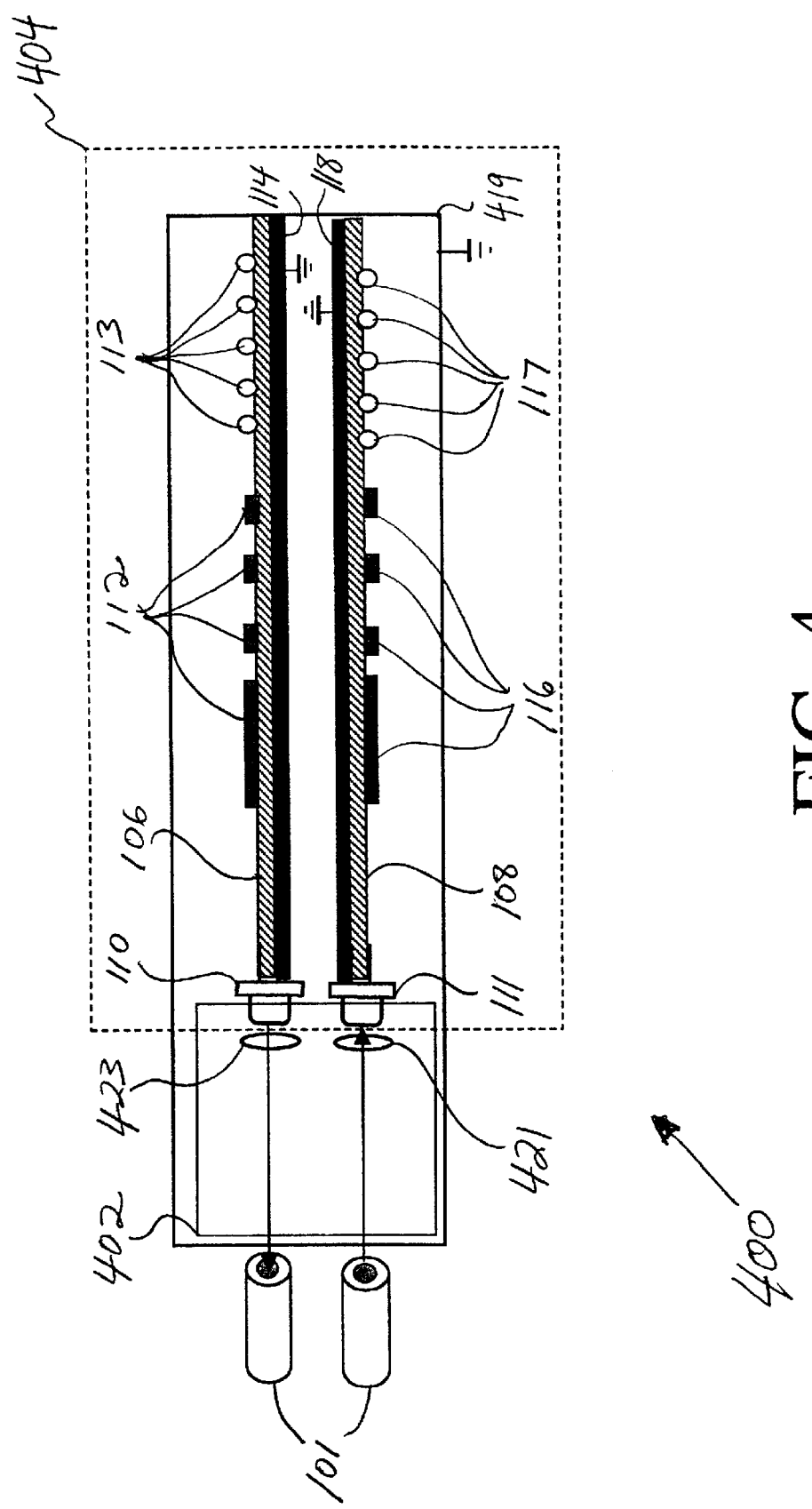
FIG. 4 is a simplified top cutaway view of a second embodiment of the present invention.

FIG. 4 illustrates a second embodiment of the present invention. To couple to the optical fibers 101, a fiber optic module 400 includes an optical block 402 and electrical elements 404. Electrical elements 404 include transmitter PCB 106, receiver PCB 108, light receiver 111, light transmitter 110, and a shielded housing 419. Shielded housing 419 may be narrower than shielded housing 119 due to receiver 111 and transmitter 110 being parallel with the PCBs 108 and 106. Optical block 402 includes lens 423 and lens 421 for coupling light or photons into and out of the fiber optic cable 101. Lens 423 and 421 may be spherical lenses or each may be a pair of aspheric lenses on the same optical axis. Light or photons emitted by the transmitter 110 are collected and focused by lens 423 into a transmit fiber optic cable. Light or photons on a receive fiber optic cable are collected and focused by lens 421 into the receiver 111. In this manner, fiber optic module 400 keeps light or photons substantially in parallel and does not have to reflect the light or photons to couple it with receiver 111 or transmitter 110.

Figure 5:
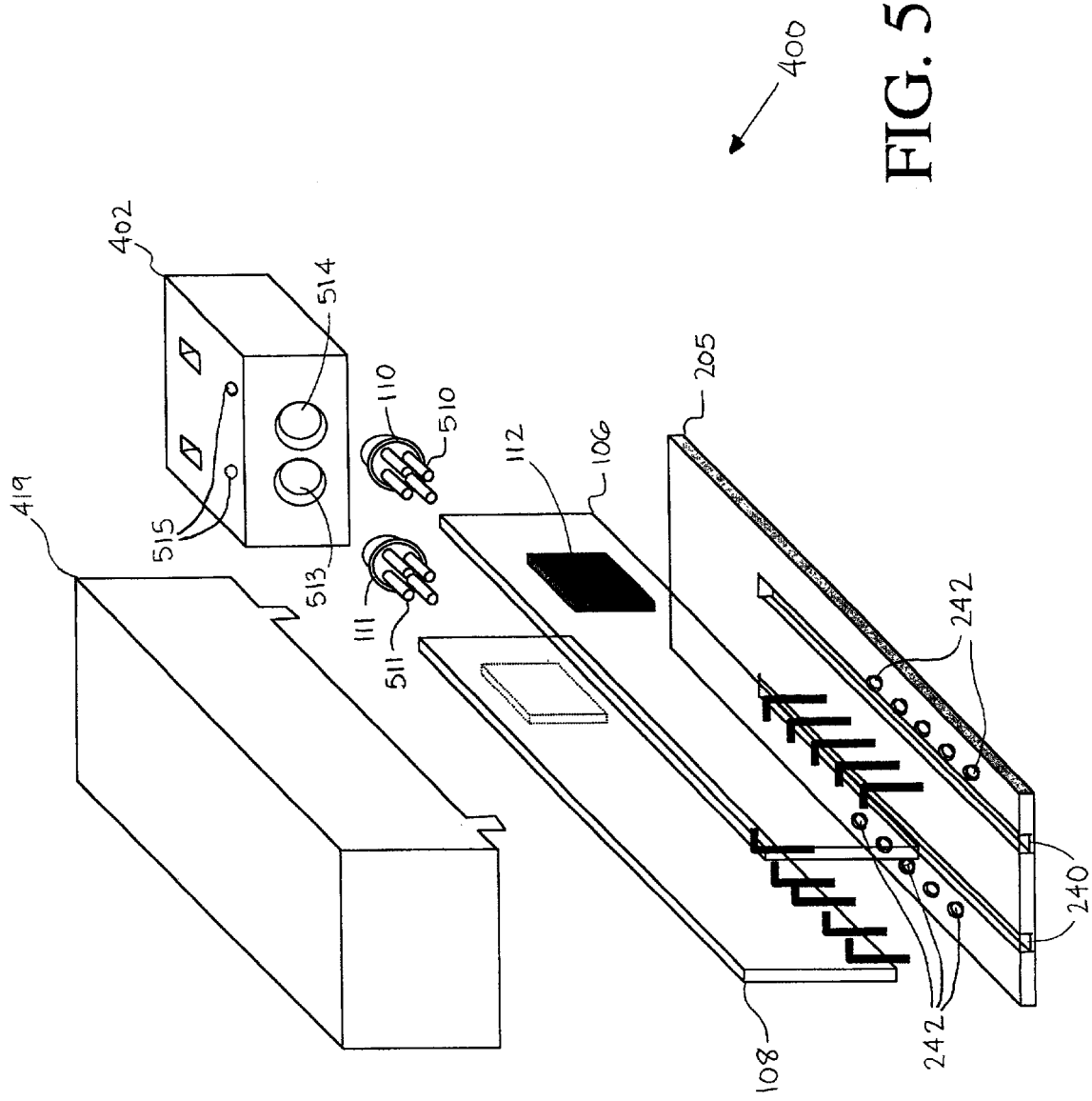
FIG. 5 is an exploded view of the second embodiment of the present invention.

FIG. 5 illustrates an exploded diagram of the fiber optic module 400. Fiber optic module 400 is assembled similar to fiber optic module 100 as previously described with reference to FIG. 2. However, optical block 402 differs from optical block 102. Receiver 111 and transmitter 110 are inserted into openings 513 and 514 respectively in the optical block 402. An epoxy is injected in top and bottom tacking holes 515 of the optical block 402 and the receiver 111 and transmitter 110 are tested and aligned to substantially couple light or photons into and out of fiber optic cables. After the epoxy is set and the receiver and transmitter are substantially fixed in the optical block 102, the transmit PCB 106 and the receive PCB 108 are coupled respectively to the transmitter 110 and the receiver 111. The terminals 511 and 510 of the receiver 111 and the transmitter 110 respectively are soldered directly onto the PCB. The high frequency pins associated with the receiver 111 and transmitter 110 are preferably soldered on the component side of the printed circuit boards in order to provide proper shielding. The alignment plate 201, the nose 202 and the nose shielding 203 are unnecessary in this embodiment of the present invention. Fiber ferrules are utilized instead for alignment between the optical block 402 and the optical fibers 101.

Referring now to FIG. 6A, a cross-sectional view of the optical block 402 for the second embodiment is illustrated. The transmitter 110 and the receiver 111 are coupled to the optical block 402. The transmitter 110 includes an emitter 302 for generation of light or photons. The receiver 111 includes a detector 304 to receive light or photons. Light or photons emitted by the emitter 302 are coupled into lens 423, collected and focused into the optical fiber through the optical port 417A. Light or photons, incident from a fiber optic cable coupled to the fiber optic module 400, is received through the optical port 417B. Photons from the fiber optic cable are incident upon the lens 421. Lens 421 collects and focuses the incident light or photons from the fiber optic cable onto the detector 304 of the receiver 111. In order to keep the optical fibers 101 in alignment with the optical block 402, a pair of fiber ferrules 422 are provided. The fiber ferrules 422 are inserted into the optical ports 417A and 417B.

Figure 6D:
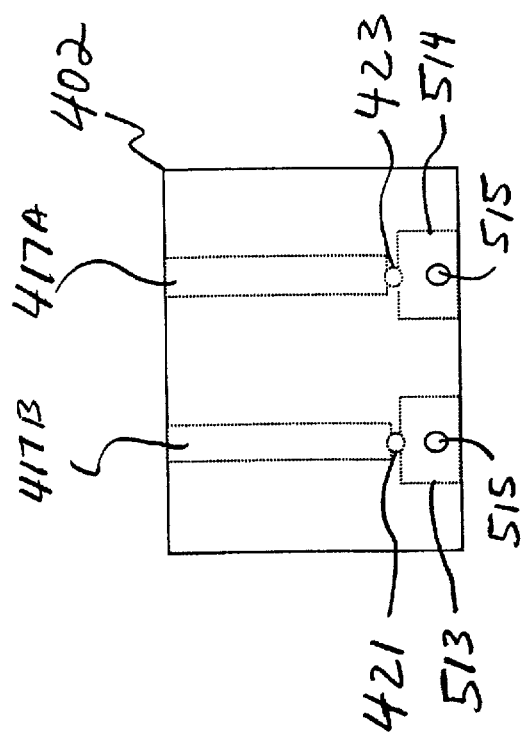
FIG. 6D is a top side view of the optic block for the second embodiment of the present invention.
Figure 6B:
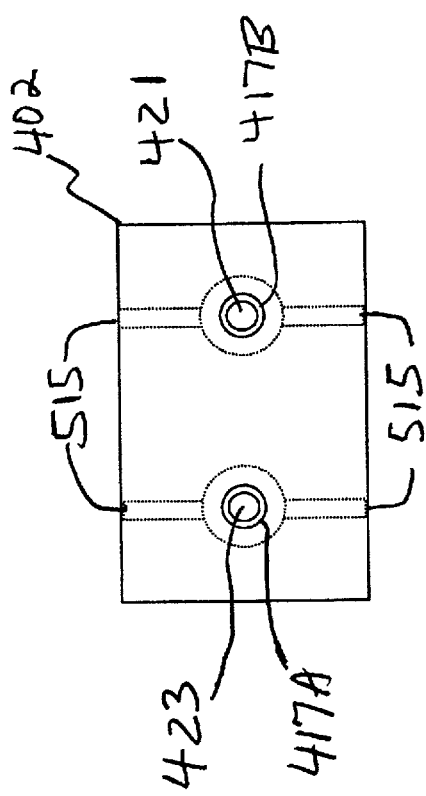
FIG. 6B is a front side view of the optic block for the second embodiment of the present invention.
Figure 6C:
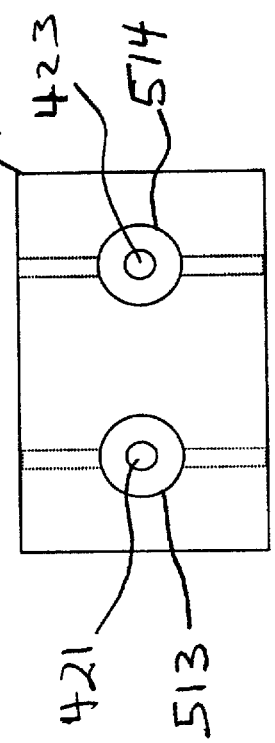
FIG. 6C is a back side view of the optic block for the second embodiment of the present invention.

FIG. 6B illustrates the front side of the optical block 402. The front side of the optical block 402 includes optical output ports 417A and 417B. In FIG. 6B, the lens 421 is visible through the optical output port 417B and the lens 423 is visible through the optical output port 417A. FIG. 6C is an illustration of the back side of the optical block 402. In FIG. 6C, the lens 421 is visible through opening 513 and lens 423 is visible through opening 514. FIG. 6D illustrates the top side of the optical block 402 which has the tacking holes 515 coupling to the openings 513 and 514. Epoxy may be inserted into the top and bottom tacking holes 515 to hold the transmitter 110 and receiver 111 in position in the optical block 402.

Referring now to FIGS. 7A–7B, final steps of the assembly of printed circuit boards 106 and 108 are illustrated. Transmit PCB 106 and receive PCB 108 are assembled as one unit on one printed circuit board 700 with a center score 702 defining a boundary line between transmit and receive components. After all components have been attached and assembled onto the unitary PCB 700, the PCB 700 is flexed along the score 702 such that the transmit PCB 106 and the receive PCB 108 may be separated. Transmit PCB 106 and the receive PCB 108 may thereafter be assembled as part of the fiber optic module 100 and the fiber optic module 400. The transmit PCB 106 and the receive PCB 108 may each be approximately 6.5 mm in height excluding pins 113 and 117.

Figure 8:
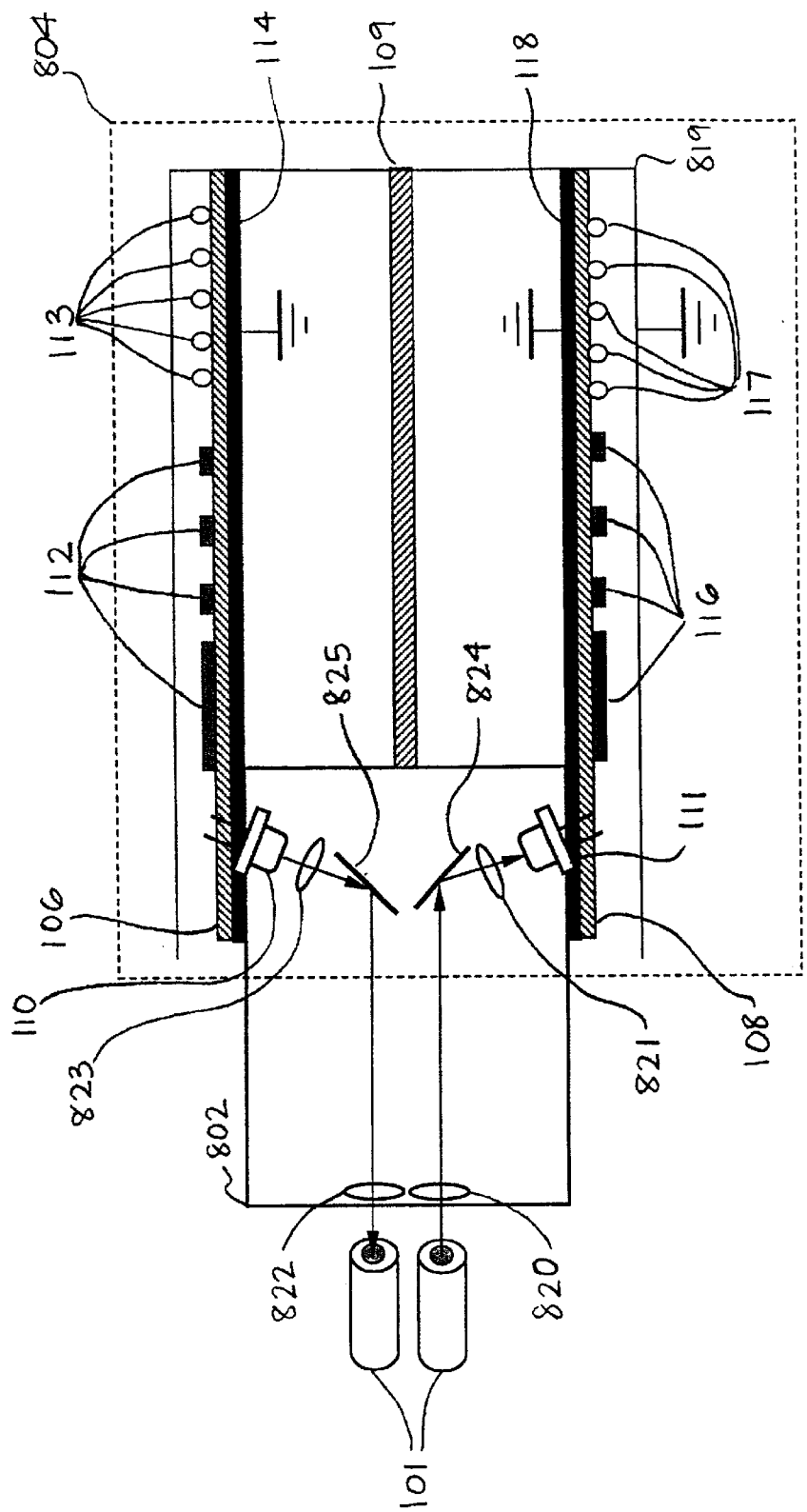
FIG. 8 is a simplified top cutaway view of a third embodiment of the present invention.

FIG. 8 illustrates a third embodiment of the present invention. To couple to the optical fibers 101, a fiber optic module 800 includes an optical block 802 and electrical elements 804. Fiber optic module 800 is similar to fiber optic module 100 as previously described, except that, optical block 802 differs from optical block 102. Optical block 802 includes lenses 820–823 and reflectors 824–825 for coupling light or photons into and out of the fiber optic cable 101. Additionally, optical block 802 may be constructed of one or several pieces split between receive optics and transmit optics or the type of optical elements. Electrical elements 804 include transmitter PCB 106, receiver PCB 108, light receiver 111, light transmitter 110, and a shielded housing 819. Shielded housing 819 may be narrower than shielded housing 119 because of the improvements to the optical block 802.

Lenses 820–823 of the optical block may be any culminating lenses including aspheric lenses. Lenses 820–823 may be symmetric (circular symmetry) or asymmetric to provide optical steering. Lens 823 is for collimating the light or photons diverging from the transmitter 110 and lens 822 is for focussing the collimated light or photons into an optical fiber. Lens 820 is for collimating the light or photons diverging out from the end of an optical fiber and lens 821 is for focusing the collimated light or photons into the receiver 111. Reflectors 824–825 may be facets formed in the optical block having angles to provide total internal reflection between the optical block material and the atmosphere for incident light. Preferably the reflectors 824–825 are on a thirty degree angle with the fiber axis. The fiber axis is an axis or line emanating from the circular center of a perfectly coupled optical fiber. Alternatively, the facets may be coated with a reflective or mirror surface to reflect light or photons off the reflective coated surface to reflect photons. Additionally, the reflector 825 may be a beam shaper to form a more uniform light pattern for more efficient optical fiber coupling. The reflector 825 may include an optical grating surface or a prism as the beam shaper. The optical block 802 is constructed from similar materials and in a similar method as optical block 102.

Figure 9:
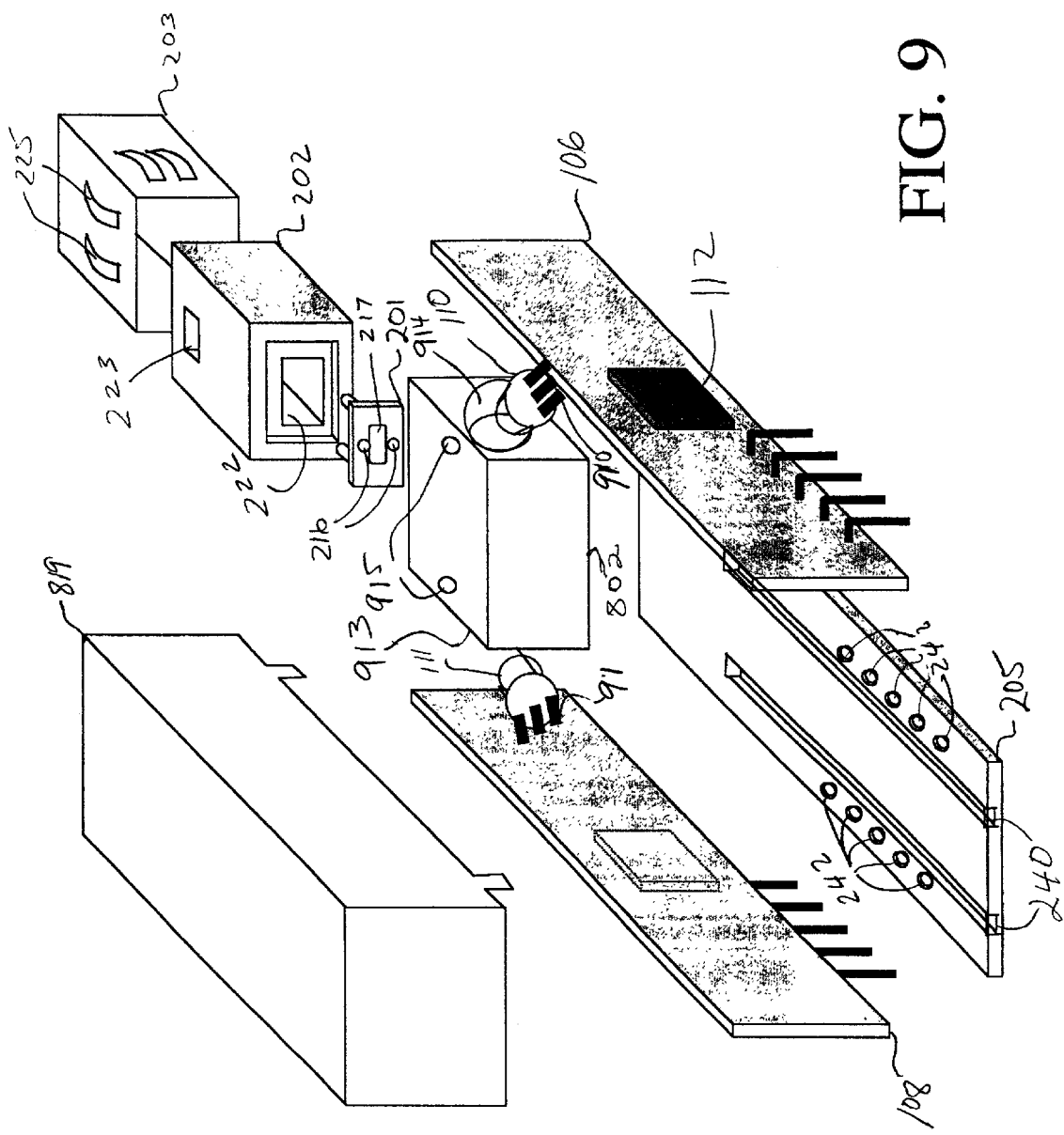
FIG. 9 is an exploded view of the third embodiment of the present invention.

FIG. 9 illustrates an exploded diagram of the fiber optic module 800. Fiber optic module 800 is assembled similar to fiber optic module 100 as previously described with reference to FIG. 2. However, optical block 802 differs from optical block 102. Receiver 111 and transmitter 110 are inserted into openings 913 and 914 respectively in the optical block 802. An epoxy is injected in top and bottom tacking holes 915 of the optical block 802 and the receiver 111 and transmitter 110 are passively aligned therein. Due to improvements in the optical block 802, the receiver 111 and transmitter 110 can be mechanically aligned, without powering the optoelectronic devices and performing an active alignment, and provide sufficient efficiency of coupling light or photons into and out of fiber optic cables. Additionally, two dimensional alignment in X-Y directions is only necessary due to the improved optical block 802. Needing to perform only passive alignment over two dimensions reduces manufacturing costs of the fiber optic module 800. After the epoxy is set and the receiver 111 and transmitter 110 are substantially fixed in the optical block 102, the transmit PCB 106 and the receive PCB 108 are coupled respectively to the transmitter 110 and the receiver 111. The terminals 911 and 910 of the receiver 111 and the transmitter 110 may be bent-lead terminals or straight terminals to couple to the receiver pin holes 232 and the transmitter pin holes 233 respectively.

Figure 10A:
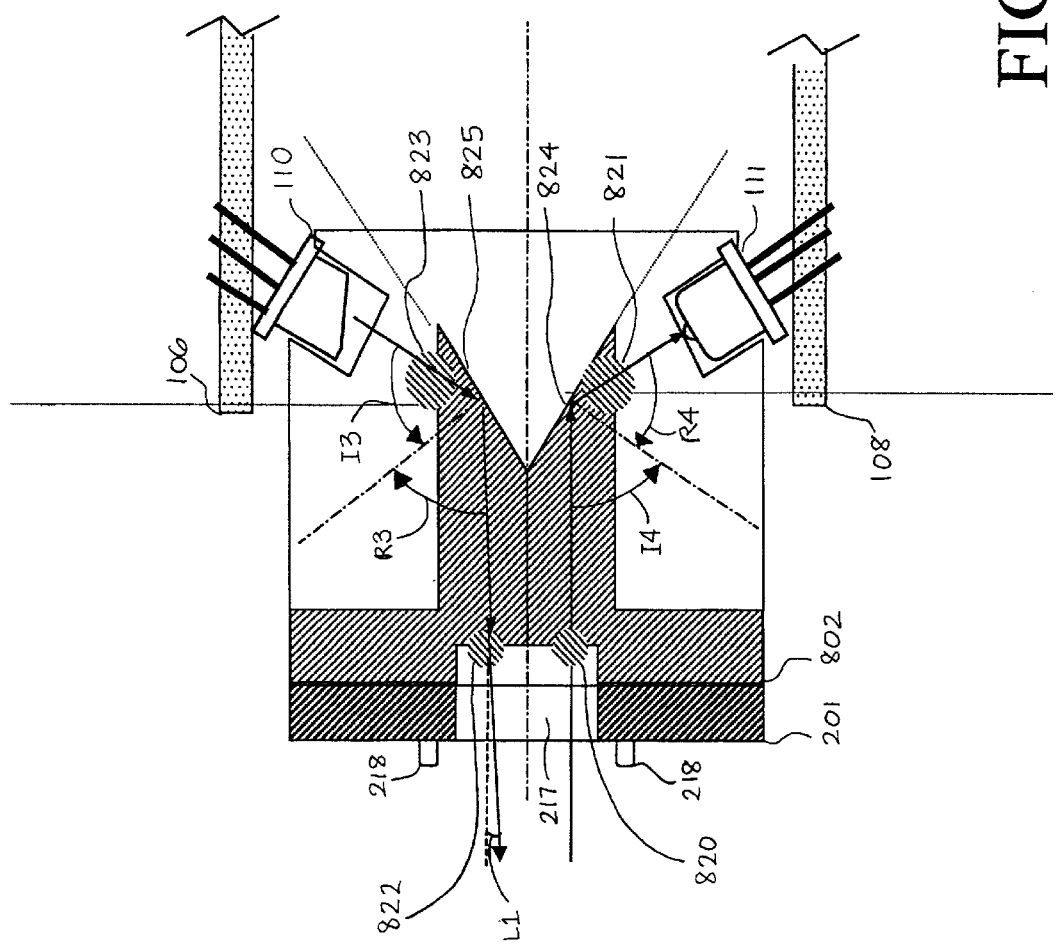
FIG. 10 is a cross-sectional view from the top of the optic block for the third embodiment of the present invention.
FIG. 10B is a right side view of the optic block for the third embodiment of the present invention.
FIG. 10C is a left side view of the optic block for the third embodiment of the present invention.
FIG. 10D is a top side view of the optic block for the third embodiment of the present invention.

Referring now to FIG. 10A, a cross-sectional view of the optical block 802 for the second embodiment is illustrated. The transmitter 110, the receiver 111, and the MT alignment plate 201 are coupled to the optical block 802. The receiver 111 and transmitter 110 may be passively aligned such that they do not make a forty five degree reflective angle (R4) or incident angle (I3) respectively with reflectors 824 and 825. R4 and I3 are angles greater than forty-five degrees. A first preferable range of angles of alignment, forming the reflective angle R4 and incident angle I3, is between fifty to seventy degrees and a second preferable range of angles of alignment is between fifty-five to sixty-five degrees.

Light or photons emitted by the transmitter 110 are coupled into lens 823 and collimated onto the reflector 825 at an incident angle I3 (angle with the perpendicular to reflector 825 surface) not equal to forty five degrees. Reflector 825 reflects the incident light or photons on a reflective angle R3 (angle with the perpendicular to reflector 825 surface). If reflector 825 is only a reflective surface, the reflective angle R3 is equivalent to the incident angle I3. If reflector 825 is a beam shaper the reflective angle R3 may not be equal to the incident angle I3. With a beam shaper, the reflective angle R3 may be off the fiber axis by the angle L1, referred to as the launch angle. The launch angle L1 ranges between zero and thirty degrees. The reflected light or photons travel towards the lens 822. Lens 822 focuses the light or photons from the transmitter 110 into an aligned optical fiber through the optical port 417A. Thus with optical block 802, light or photons coupled or launched into an optical fiber, are non-orthogonal to the light or photons emitted and incident upon lens 823 from the transmitter 110.

Light or photons, incident from a fiber optic cable coupled to the fiber optic module 800, is received through the optical port 417A. Light or photons from the fiber optic cable are aligned to be incident upon the lens 820. Lens 820 collimates and focuses the incident light or photons from a fiber optic cable onto the reflector 824 at an incident angle I4. Reflector 824 reflects incident light or photons at a reflective angle R4. The reflective angle R4 is equivalent to the incident angle I4. Lens 821 focuses the light or photons received from a fiber optical cable into the receiver 111. Thus with optical block 802, light or photons incident from a fiber optic cable are non-orthogonal to the light or photons incident upon the receiver 111.

Similar to optical block 102 illustrated in FIG. 3B, the front side of the optical block 802 includes optical block alignment pins 316 and an optical output port 317. The optical block alignment pins 316 couple to the alignment holes 216 of the alignment plate 201 such that the optical output port 317 is aligned with the optical port 417A.

Figure 10D:
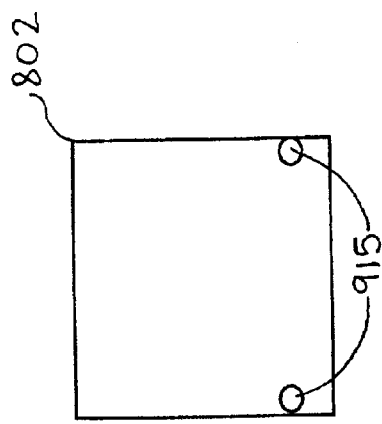
Figure 10C:
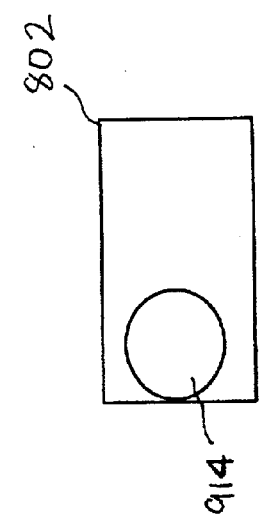
Figure 10B:
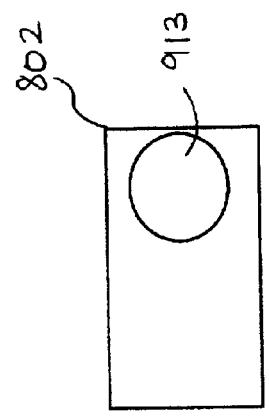

FIG. 10B illustrates the right side of the optical block which has the opening 914 to mate with the type of housing of the transmitter 110. FIG. 10C illustrates the left side of the optical block 802 which has the opening 913 to mate with the type of housing of the receiver 111. Comparing FIGS. 10B and 10C, there is no offset between the openings 913 and 914 because the optical block 802 does not need it to avoid optical crosstalk. This is another reason optical block 802 can be smaller than optical block 102 so as to further reduce the footprint and manufacturing costs of the fiber optic module 800. FIG. 10D illustrates the top side of the optical block 802 which has the top tacking holes 915 coupling to openings 913 and 914. Epoxy may be inserted into the top and bottom tacking holes 915 to hold the transmitter 110 and receiver 111 in position.

Figure 11:
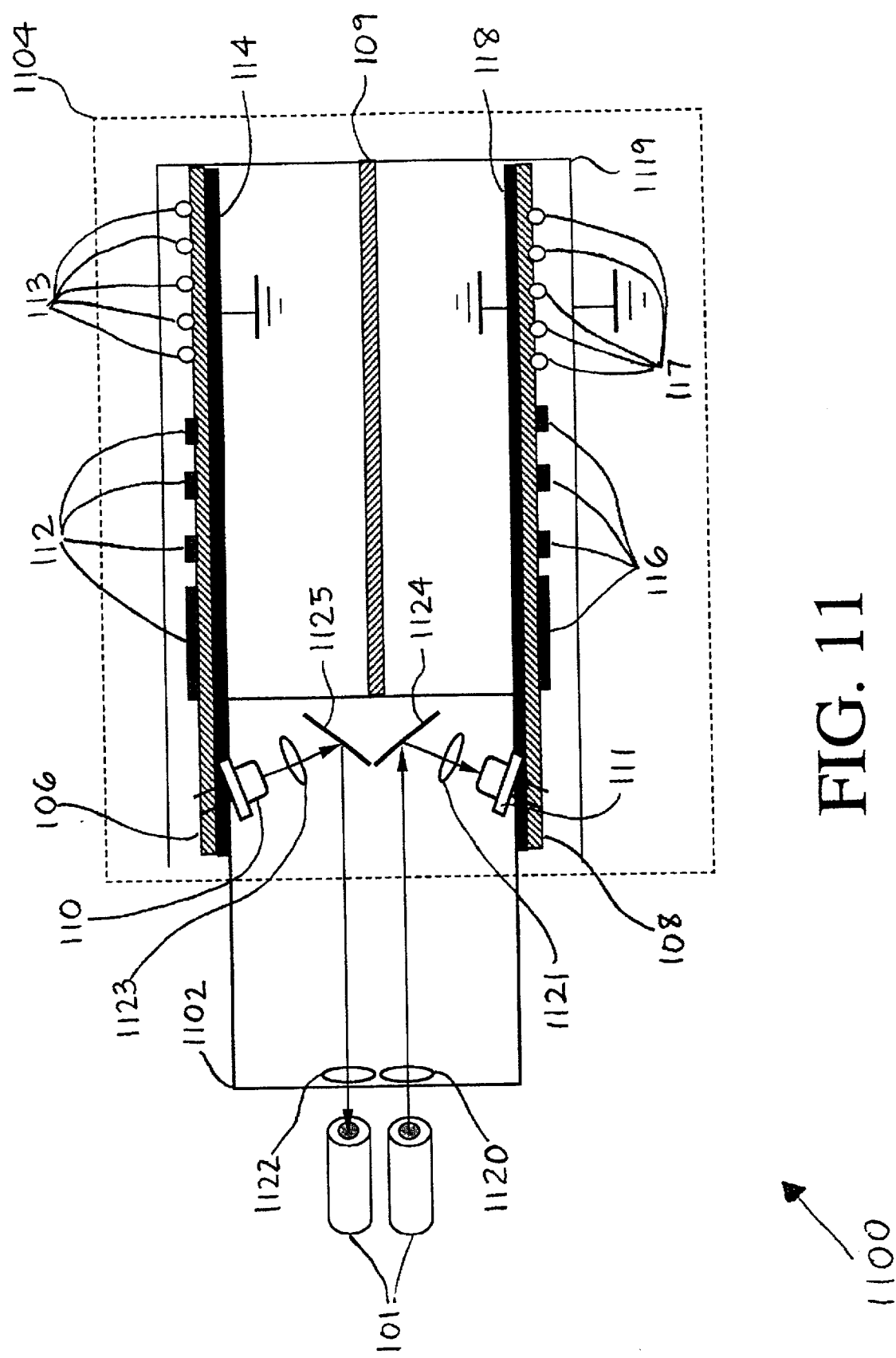
FIG. 11 is a simplified top cutaway view of a fourth embodiment of the present invention.

FIG. 11 illustrates a fourth embodiment of the present invention. To couple to the optical fibers 101, a fiber optic module 1100 includes an optical block 1102 and electrical elements 1104. Fiber optic module 1100 is similar to fiber optic module 100 as previously described, except that, optical block 1102 differs from optical block 102. Optical block 1102 includes lenses 1120–1123 and reflectors 1124–1125 for coupling light or photons into and out of the fiber optic cable 101. Additionally, optical block 1102 may be constructed of one or several pieces split between receive optics and transmit optics or the type of optical elements. Electrical elements 1104 include transmitter PCB 106, receiver PCB 108, light receiver 111, light transmitter 110, and a shielded housing 1119. Shielded housing 1119 may be narrower than shielded housing 119 because of the improvements to the optical block 1102.

Lenses 1120–1123 of the optical block may be any culminating lenses including aspheric lenses. Lenses 1120–1123 may be symmetric (circular symmetry) or asymmetric to provide optical steering. Lens 1123 is for collimating the light or photons diverging from the transmitter 110 and lens 1122 is for focussing the collimated light or photons into an optical fiber. Lens 1120 is for collimating the light or photons diverging out from the end of an optical fiber and lens 1121 is for focusing the collimated light or photons into the receiver 111. Reflectors 1124–1125 are facets formed in the optical block. Preferably the reflectors 1124–1125 are on a sixty degree angle with the fiber axis. Alternatively, the facets need to be coated with a reflective or mirror surface to reflect light or photons off it. Additionally, the reflector 1125 may be a beam shaper to form a more uniform light pattern for more efficient optical fiber coupling. The reflector 1125 may include an optical grating surface or a prism as the beam shaper. The optical block 1102 is constructed from similar materials and in a similar method as optical block 102.

Figure 12:
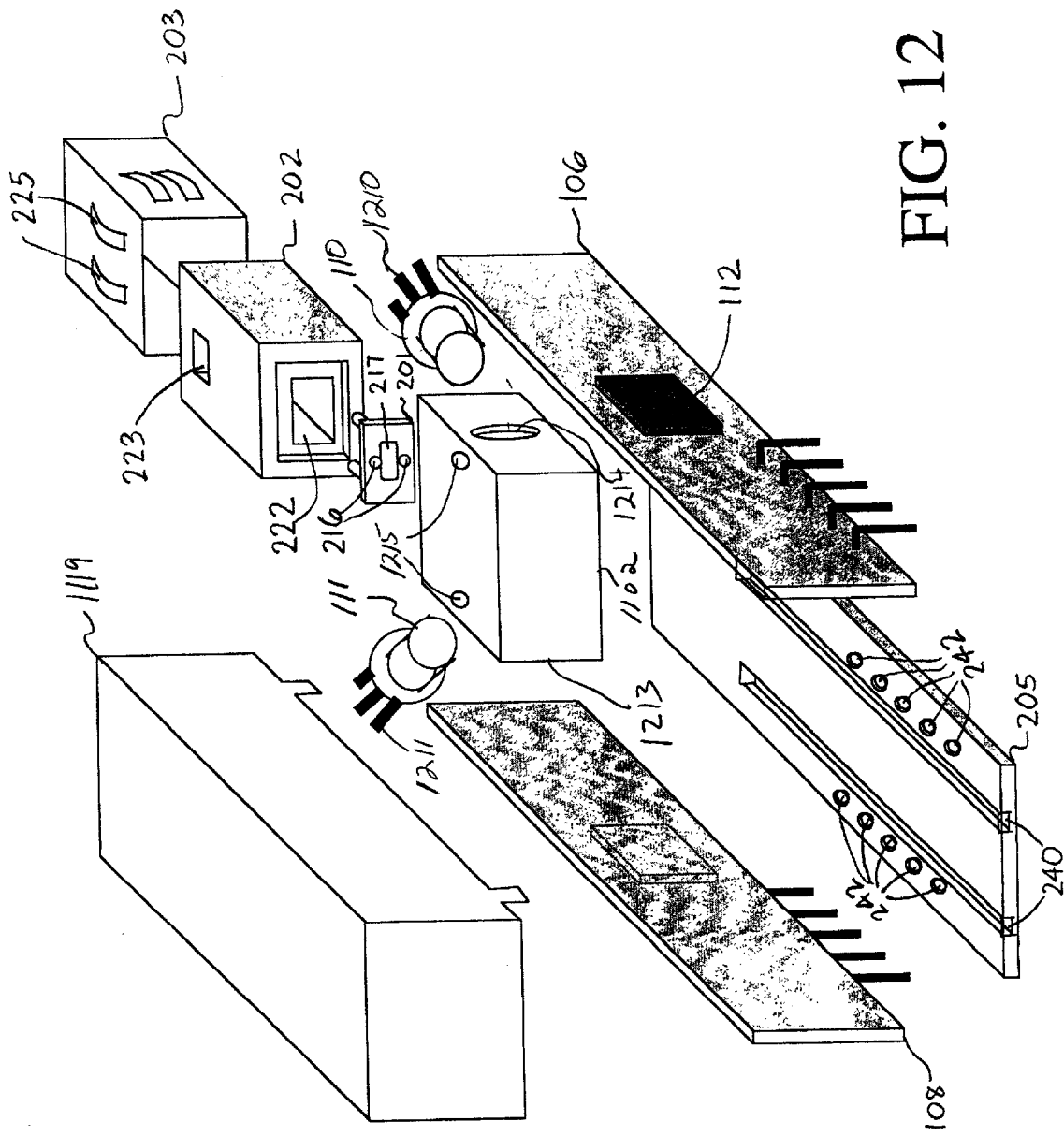
FIG. 12 is an exploded view of the fourth embodiment of the present invention.

FIG. 12 illustrates an exploded diagram of the fiber optic module 1100. Fiber optic module 1100 is assembled similar to fiber optic module 100 as previously described with reference to FIG. 2. However, optical block 1102 differs from optical block 102 but is very similar to optical block 802. Receiver 111 and transmitter 110 are inserted into openings 1213 and 1214 respectively in the optical block 1102. An epoxy is injected in top and bottom tacking holes 1215 of the optical block 1102 and the receiver 111 and transmitter 110 may be passively aligned therein. Due to improvements in the optical block 1102, the receiver 111 and transmitter 110 can be mechanically aligned, without powering the optoelectronic devices and performing an active alignment, and provide sufficient efficiency of coupling light or photons into and out of fiber optic cables. Additionally, two dimensional alignment in X-Y directions is only necessary due to the improved optical block 1102. Needing to perform only passive alignment over two dimensions reduces manufacturing costs of the fiber optic module 1100. After the epoxy is set and the receiver 111 and transmitter 110 are substantially fixed in the optical block 102, the transmit PCB 106 and the receive PCB 108 are coupled respectively to the transmitter 110 and the receiver 111. The terminals 1211 and 1210 of the receiver 111 and the transmitter 110 may be bent-lead terminals or straight terminals to couple to the receiver pin holes 232 and the transmitter pin holes 233 respectively.

Figure 13A:
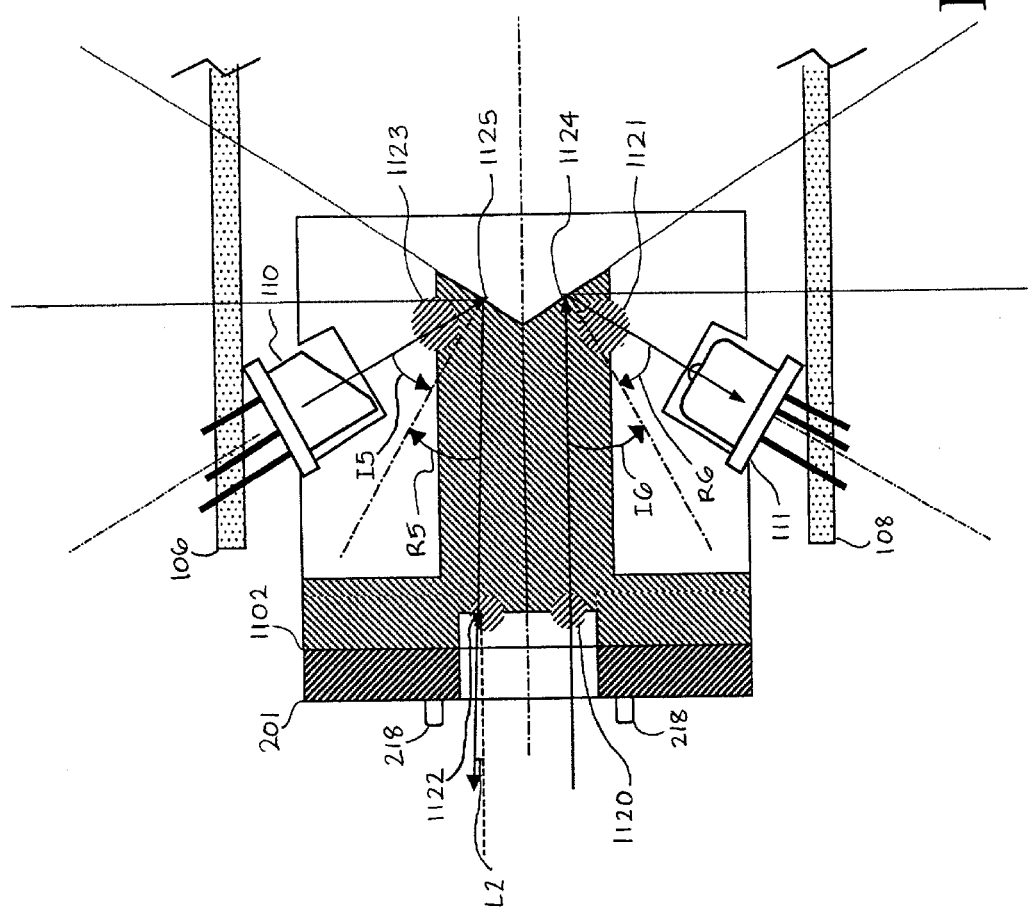
FIG. 13A is a cross-sectional view from the top of the optic block for the fourth embodiment of the present invention.

Referring now to FIG. 13A, a cross-sectional view of the optical block 1102 for the second embodiment is illustrated. The transmitter 110, the receiver 111, and the MT alignment plate 201 are coupled to the optical block 1102. The receiver 111 and transmitter 110 are passively aligned such that they do not make a forty five degree reflective angle (R6) or incident angle (I5) respectively with reflectors 1124 and 1125. R6 and I5 are angles less than forty-five degrees. A first preferable range of angles of alignment, forming the reflective angle R6 and incident angle I5, is between twenty to forty degrees and a second preferable range of angles of alignment is between twenty-five to thirty-five degrees.

Light or photons emitted by the transmitter 110 are coupled into lens 1123 and collimated onto the reflector 1125 at an incident angle I5 (angle with the perpendicular to reflector 1125 surface) not equal to forty five degrees. Reflector 1125 reflects the incident light or photons on a reflective angle R5 (angle with the perpendicular to reflector 1125 surface). If reflector 1125 is only a reflective surface, the reflective angle R5 is equivalent to the incident angle I5. If reflector 1125 is a beam shaper the reflective angle R5 may not be equal to the incident angle I5. With a beam shaper, the reflective angle R5 may be off the fiber axis by the angle L1, referred to as the launch angle. The launch angle L1 ranges between zero and thirty degrees. The reflected light or photons travel towards the lens 1122. Lens 1122 focuses the light or photons from the transmitter 110 into an aligned optical fiber through the optical port 417A. Thus with optical block 1102, light or photons coupled or launched into an optical fiber, are non-orthogonal to the light or photons emitted and incident upon lens 1123 from the transmitter 110.

Light or photons, incident from a fiber optic cable coupled to the fiber optic module 1100, is received through the optical port 417A. Light or photons from the fiber optic cable are aligned to be incident upon the lens 1120. Lens 1120 collimates and focuses the incident light or photons from a fiber optic cable onto the reflector 1124 at an incident angle I6. Reflector 1124 reflects incident light or photons at a reflective angle R6. The reflective angle R6 is equivalent to the incident angle I6. Lens 1121 focuses the light or photons received from a fiber optical cable into the receiver 111. Thus with optical block 1102, light or photons incident from a fiber optic cable are non-orthogonal to the light or photons incident upon the receiver 111.

Similar to optical block 102 illustrated in FIG. 3B, the front side of the optical block 1102 includes optical block alignment pins 316 and an optical output port 317. The optical block alignment pins 316 couple to the alignment holes 216 of the alignment plate 201 such that the optical output port 317 is aligned with the optical port 417A.

FIG. 13B illustrates the right side of the optical block which has the opening 1114 to mate with the type of housing of the transmitter 110. FIG. 13C illustrates the left side of the optical block 1102 which has the opening 1113 to mate with the type of housing of the receiver 111. Comparing FIGS. 13B and 13C, there is no offset between the openings 1113 and 1114 because the optical block 1102 does not need it to avoid optical crosstalk. This is another reason optical block 1102 can be smaller than optical block 102 so as to further reduce the footprint and manufacturing costs of the fiber optic module 1100. FIG. 13D illustrates the top side of the optical block 1102 which has the top tacking holes 1215 coupling to openings 1213 and 1214. Epoxy may be inserted into the top and bottom tacking holes 1215 to hold the transmitter 110 and receiver 111 in position.

Figure 14:
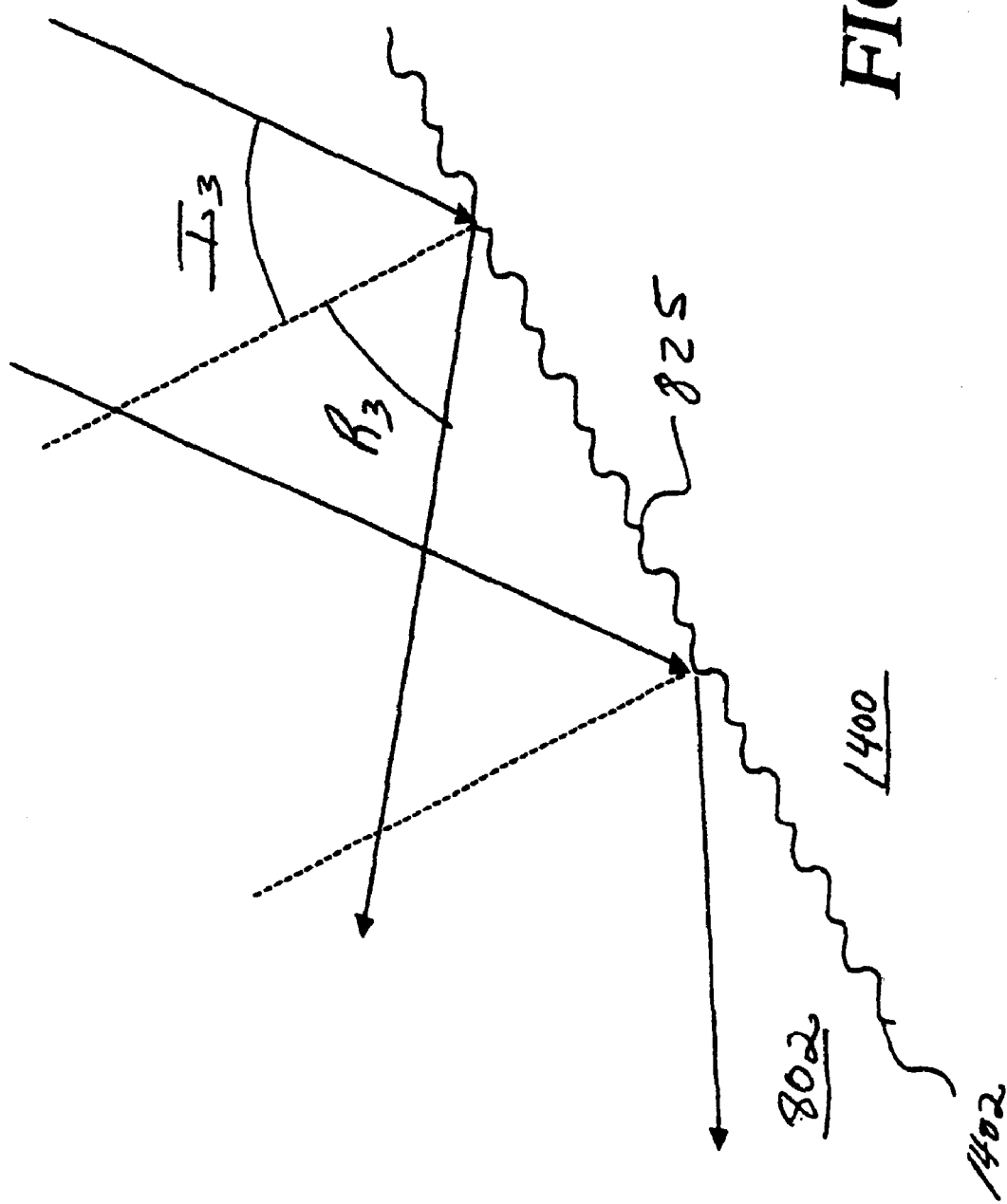
FIG. 14 is a cross-sectional view of an exemplary beam shaper.

FIG. 14 is illustrative of one type of beam shaper, an optical grating surface 1402. Optical grating surface 1402 forms the reflector 825. The optical grating surface is formed into the optical block 802 leaving the atmosphere 1400 on the opposite side. The optical grating surface 1402 can be formed as part of the injection molding of the optical block or it may be etched into the surface or a film whose thickness or refractive index is periodically modulated could be adhesively coupled to the reflective surface. Light within the optical block 802 at an incident angle I3 is diffracted by the optical grating surface 1402 at a diffractive angle R3. The diffractive angle R3 depends upon the point where the incident ray strikes the optical grating surface 1402. The differences in diffractive angles provides for the beam mode mixing.

The reflecting surface includes a beam shaper in order to mix the spatial modes. The uniformly mixed modes reduce the effect known as the modal noise. The off-angle launching reduces the differential mode delay phenomenon in multimode optical fibers which can reduce the optical transmission distance within an optical fiber. Using a beam shaper, the beam can also be collimated without using lenses in order to save valuable physical space within the fiber optic modules. Additionally, uniformly distributed modes decrease the alignment sensitivity of the optical coupling of the transmitter such that passive alignment need only be used. The beam shaper furthermore improves the launching of light or photons into a multimode optical fiber to stimulate other modes, referred to as a multi-mode conditional launching. This reduces the phenomena known as the differential mode delay effect.

The previous detailed description describes fiber optic modules as including a receiver and transmitter. However, one of ordinary skill can see that a fiber optic module may be a receiver only or a transmitter only such that only one board may be substantially perpendicular to the base. Additionally, the previous detailed description described one PCB board for receive and transmit functions. However, the present invention may be extended to a plurality of PCB boards substantially in parallel for providing transmit or receive functionality or both into parallel fiber optic cables.

As those of ordinary skill will recognize, the present invention has many advantages over the prior art. One advantage of the present invention is that the alignment of optoelectronic devices is simplified such that manufacturing costs are reduced. Another advantage of the present invention is that vertical PCBs provide a narrower width of fiber optic module to provide a coupling to narrower optical fiber connectors. Another advantage of the present invention is that orientation of the optoelectronics eliminates optical cross talk. Another advantage of the present invention is that the physical separation of the receive and transmit optical elements and electrical elements provides superior isolation and minimizes optical and electrical cross-talk.

The preferred embodiments of the present invention for METHOD AND APPARATUS FOR IMPROVED OPTICAL ELEMENTS FOR VERTICAL PCB FIBER OPTIC MODULES are thus described. While the present invention has been described in particular embodiments, the present invention should not be construed as limited by such embodiments, but rather construed according to the claims that follow below.

What is claimed is:

1. A fiber optic module for coupling photons between an optoelectronic device and an optical fiber, the fiber optic module comprising:
   a base having a slot and a plurality of pin holes, the base to mount the fiber optic module in a system for coupling photons between an optoelectronic device and an optical fiber;
   a printed circuit board (PCB) inserted into the slot substantially perpendicular to the base, the PCB having a plurality of pins inserted into the plurality of pin holes and an optoelectronic device to communicate with an optical fiber using photons, the optoelectronic device having terminals coupled to the PCB; and
   an optical block coupled to the optoelectronic device of the PCB to couple photons between the optoelectronic device and an optical fiber, the optical block having a reflective surface to reflect photons between the optoelectronic device and the optical fiber, the optical block coupled to the optoelectronic device such that an angle between the optoelectronic device and a line perpendicular to the reflective surface is not equal to forty five degrees or a multiple thereof.

2. The fiber optic module of claim 1 for coupling photons between an optoelectronic device and an optical fiber wherein,
   the optical block further has a first lens to focus photons and a second lens to collimate photons between the optoelectronic device and an optical fiber.

3. The fiber optic module of claim 2 for coupling photons between an optoelectronic device and an optical fiber, wherein,
   the second lens of the optical block is an aspheric lens, a ball lens or a GRIN lens.

4. The fiber optic module of claim 3 for coupling photons between an optoelectronic device and an optical fiber, wherein,
   the first lens is an asymmetric lens to steer photons or a symmetric lens to provide additional modes of coupling photons.

5. The fiber optic module of claim 3 for coupling photons between an optoelectronic device and an optical fiber, wherein,
   the second lens is an asymmetric lens to steer photons or a symmetric lens to provide additional modes of coupling photons.

6. The fiber optic module of claim 2 for coupling photons between an optoelectronic device and an optical fiber, wherein,
   the first lens of the optical block is an aspheric lens, a ball lens or a GRIN lens.

7. The fiber optic module of claim 2 for coupling photons between an optoelectronic device and an optical fiber, wherein,
   photons are to be launched into an optical fiber,
   the second lens of the optical block to receive photons from the optoelectronic device and direct them towards the reflective surface,
   the reflective surface to reflect photons received from the second lens and direct them towards the first lens and the optical fiber, and
   the first lens of the optical block to focus photons from the reflective surface into an optical fiber.

8. The fiber optic module of claim 7 for coupling photons between an optoelectronic device and an optical fiber, wherein,
   the optoelectronic device is an emitter.

9. The fiber optic module of claim 8 for coupling photons between an optoelectronic device and an optical fiber, wherein,
   the emitter is a vertical cavity surface emitting laser (VCSEL).

10. The fiber optic module of claim 2 for coupling photons between an optoelectronic device and an optical fiber, wherein, photons are to be received from an optical fiber, the second lens of the optical block to receive photons from the optical fiber and direct them towards the reflective surface, the reflective surface to reflect photons received by the second lens towards the first lens and the optoelectronic device, and the first lens of the optical block is a focusing lens to focus photons from the reflective surface into the optoelectronic device.

11. The fiber optic module of claim 10 for coupling photons between an optoelectronic device and an optical fiber, wherein, the optoelectronic device is a photodetector.

12. The fiber optic module of claim 1 for coupling photons between an optoelectronic device and an optical fiber wherein, the PCB further comprises:

electrical components coupled between the optoelectronic device and the plurality of pins on a first side of the PCB, the electrical components to control the optoelectronic device, and a ground plane coupled to a second side of the PCB to reduce electromagnetic fields generated by the electrical components.

13. The fiber optic module of claim 12 for coupling photons between an optoelectronic device and an optical fiber, the fiber optic module further comprising:

a shielded housing coupled to the base, the shielded housing encasing the PCB to reduce electromagnetic interference (EMI).

14. The fiber optic module of claim 1 for coupling photons between an optoelectronic device and an optical fiber wherein, the angle between the optoelectronic device and the line perpendicular to the reflective surface is greater than forty five degrees.

15. The fiber optic module of claim 14 for coupling photons between an optoelectronic device and an optical fiber wherein, the angle between the optoelectronic device and the line perpendicular to the reflective surface is between fifty degrees and seventy degree.

16. The fiber optic module of claim 15 for coupling photons between an optoelectronic device and an optical fiber wherein, the angle between the optoelectronic device and the line perpendicular to the reflective surface is between fifty-five degrees and sixty-five degrees.

17. The fiber optic module of claim 14 for coupling photons between an optoelectronic device and an optical fiber, wherein, the reflective surface is a boundary surface providing total internal reflection for the photons to be reflected.

18. The fiber optic module of claim 1 for coupling photons between an optoelectronic device and an optical fiber wherein, the angle between the optoelectronic device and the line perpendicular to the reflective surface is less than forty five degrees.

19. The fiber optic module of claim 18 for coupling photons between an optoelectronic device and an optical fiber wherein, the angle between the optoelectronic device and the line perpendicular to the reflective surface is between twenty degrees and forty degrees.

20. The fiber optic module of claim 19 for coupling photons between an optoelectronic device and an optical fiber wherein, the angle between the optoelectronic device and the line perpendicular to the reflective surface is between twenty-five degrees and thirty-five degrees.

21. The fiber optic module of claim 1 for coupling photons between an optoelectronic device and an optical fiber, wherein, the reflective surface is a beam shaper to reflect and alter a light beam of photons.

22. The fiber optic module of claim 21 for coupling photons between an optoelectronic device and an optical fiber, wherein, the beam shaper is an optical grating surface to scramble photo-modes and to reflect the photons.

23. The fiber optic module of claim 1 for coupling photons between an optoelectronic device and an optical fiber, wherein, the reflective surface is a mirror coated surface to reflect the photons.

24. A fiber optic transceiver for coupling photons between optoelectronic devices and optical fibers, the fiber optic transceiver comprising:

a base having a first slot near one side, a second slot near an opposite side of the first slot, a first plurality of pin holes near the one side and a second plurality of pin holes near the opposite side, the base to mount the fiber optic transceiver in a system for coupling photons between an optoelectronic device and an optical fiber;

a first printed circuit board (PCB) inserted into the first slot substantially perpendicular to the base, the first PCB having a plurality of pins inserted into the first plurality of pin holes and a first optoelectronic device to communicate with a first optical fiber using photons, the first optoelectronic device having terminals coupled to the first PCB;

a second PCB inserted into the second slot substantially perpendicular to the base, the second PCB having a second plurality of pins inserted into the second plurality of pin holes and a second optoelectronic device to communicate with a second optical fiber using photons, the second optoelectronic device having terminals coupled to the second PCB; and optical elements coupled to the first optoelectronic device of the first PCB to couple photons between the first optoelectronic device and a first optical fiber and the second optoelectronic device of the second PCB to couple photons between the second optoelectronic device and a second optical fiber, the optical elements having a first reflective surface and a second reflective surface, the optical elements coupled to the first optoelectronic device such that a first angle between the first optoelectronic device and a first line perpendicular to the first reflective surface is not equal to forty five degrees or a multiple thereof and the optical elements coupled to the second optoelectronic device such that a second angle between the second optoelectronic device and a second line perpendicular to the second reflective surface is not equal to forty five degrees or a multiple thereof.

25. The fiber optic transceiver of claim 24 for coupling photons between optoelectronic devices and optical fibers, wherein, the optical elements further have a first lens to collimate photons and a third lens to focus photons between the first optoelectronic device and the first optical fiber, a second lens to focus photons and a fourth lens to collimate photons between the second optoelectronic device and the second optical fiber.

26. The fiber optic transceiver of claim 25 for coupling photons between optoelectronic devices and optical fibers, wherein,
the first lens of the optical block is for receiving photons from the first optical fiber and collimating them towards the first reflective surface,
the first reflective surface reflects photons received by the first lens towards the third lens and the first optoelectronic device, and
the third lens of the optical block is for focusing photons from the first reflective surface into the first optoelectronic device.

27. The fiber optic module of claim 26 for coupling photons between an optoelectronic device and an optical fiber, wherein,
the fourth lens of the optical block to receive photons from the second optoelectronic device and collimate them towards the second reflective surface,
the second reflective surface to reflect photons received from the fourth lens and direct them towards the second lens and the second optical fiber, and
the second lens of the optical block to focus photons from the second reflective surface into the second optical fiber.

28. The fiber optic transceiver of claim 27 for coupling photons between optoelectronic devices and optical fibers, wherein,
the first optoelectronic device is a photodetector, and
the second optoelectronic device is and emitter.

29. The fiber optic transceiver of claim 28 for coupling photons between optoelectronic devices and optical fibers, wherein,
the emitter is a vertical cavity surface emitting laser (VCSEL).

30. The fiber optic transceiver of claim 26 for coupling photons between optoelectronic devices and optical fibers, wherein,
the first optoelectronic device is a photodetector.

31. The fiber optic transceiver of claim 25 for coupling photons between optoelectronic devices and optical fibers, wherein,
the first, second, third and fourth lenses of the optical block are from the set of aspheric lenses, ball lenses, or GRIN lenses.

32. The fiber optic transceiver of claim 25 for coupling photons between optoelectronic devices and optical fibers, wherein,
the first, second, third and fourth lenses of the optical block are lenses to steer photons or to provide additional modes of coupling photons.

33. The fiber optic module of claim 25 for coupling photons between an optoelectronic device and an optical fiber, wherein,
the fourth lens of the optical block to receive photons from the second optoelectronic device and collimate them towards the second reflective surface,
the second reflective surface to reflect photons received from the fourth lens and direct them towards the second lens and the second optical fiber, and
the second lens of the optical block to focus photons from the second reflective surface into the second optical fiber.

34. The fiber optic transceiver of claim 33 for coupling photons between optoelectronic devices and optical fibers, wherein,
the second optoelectronic device is an emitter.

35. The fiber optic transceiver of claim 34 for coupling photons between optoelectronic devices and optical fibers, wherein,
the emitter is a vertical cavity surface emitting laser (VCSEL).

36. The fiber optic module of claim 24 for coupling photons between an optoelectronic device and an optical fiber wherein,
the first and second angles are greater than forty five degrees.

37. The fiber optic module of claim 36 for coupling photons between an optoelectronic device and an optical fiber wherein,
the first and second angles are between fifty degrees seventy degrees.

38. The fiber optic module of claim 37 for coupling photons between an optoelectronic device and an optical fiber wherein,
the first and second angles are between fifty-five degrees and sixty-five degrees.

39. The fiber optic transceiver of claim 36 for coupling photons between optoelectronic devices and optical fibers, wherein,
the first and second reflective surfaces are boundary surfaces providing total internal reflection for the photons to be reflected.

40. The fiber optic module of claim 24 for coupling photons between an optoelectronic device and an optical fiber wherein,
the first and second angles are less than forty five degrees.

41. The fiber optic module of claim 40 for coupling photons between an optoelectronic device and an optical fiber wherein,
the first and second angles are between twenty degrees and forty five degrees.

42. The fiber optic module of claim 41 for coupling photons between an optoelectronic device and an optical fiber wherein,
the first and second angles are between twenty-five degrees and thirty-five degrees.

43. The fiber optic transceiver of claim 24 for coupling photons between an optoelectronic device and an optical fiber wherein,
the second reflective surface is a beam shaper to reflect and alter a light beam of photons.

44. The fiber optic transceiver of claim 43 for coupling photons between optoelectronic devices and optical fibers, wherein,
the beam shaper is an optical grating surface to scramble photo-modes and to reflect photons.

45. The fiber optic transceiver of claim 24 for coupling photons between optoelectronic devices and optical fibers, wherein,
the first and second reflective surfaces are mirror coated surfaces to reflect photons.

46. The fiber optic transceiver of claim 24 for coupling photons between optoelectronic devices and optical fibers, the fiber optic transceiver further comprising:
an internal shield inserted between the first PCB and the second PCB, the internal shield further reducing electrical crosstalk.

47. The fiber optic transceiver of claim 27 for coupling photons between optoelectronic devices and optical fibers wherein, the first PCB further comprises:
first electrical components coupled between the optoelectronic device and the plurality of pins on a first side of the first PCB, the first electrical components to control the first optoelectronic device, and
a first ground plane coupled to a second side of the first PCB to reduce electromagnetic fields; and, the second PCB further comprises:
second electrical components coupled between the optoelectronic device and the plurality of pins on a first side of the second PCB, the second electrical components to control the second optoelectronic device, and
a second ground plane coupled to a second side of the second PCB to reduce electromagnetic fields.

48. A fiber optic transceiver for transmitting and receiving photons over optical fibers, the fiber optic transceiver comprising:
a transmitter to transmit photons;
a receiver to receive photons; and
an optical block to couple light between optical fibers and the transmitter and the receiver, the optical block having
a first reflector to reflect photons between the receiver and a first optical fiber,
a second reflector to reflect photons between the transmitter and a second optical fiber,
a receive opening on one side of the optical block to receive the receiver at an angle with a line perpendicular to the first reflector not equal to forty-five degrees,
a transmit opening on an opposite side of the optical block opposite the receive opening, the transmit opening to receive the transmitter at an angle with a line perpendicular to the second reflector not equal to forty five degrees,
a first lens, the first reflector, and a third lens in an optical path between the receive opening and the first optical fiber, and
a second lens, the second reflector, and a fourth lens in an optical path between the transmit opening and the second optical fiber.

49. The fiber optic transceiver of claim 48 for transmitting and receiving photons over optical fibers, wherein,
the angle for receiving the receiver through the receive opening is less than forty five degrees,
and wherein,
the angle for receiving the transmitter through the transmit opening is less than forty five degrees.

50. The fiber optic transceiver of claim 48 for transmitting and receiving photons over optical fibers, wherein,
the angle for receiving the receiver through the receive opening is greater than forty five degrees,
and wherein,
the angle for receiving the transmitter through the transmit opening is greater than forty five degrees.

51. The fiber optic transceiver of claim 50 for transmitting and receiving photons over optical fibers, wherein,
the first reflector and the second reflector are boundary surfaces providing sufficient index of refraction to provide total internal reflection of incident light.

52. The fiber optic transceiver of claim 48 for transmitting and receiving photons over optical fibers, wherein the optical block of the fiber optic transceiver further has:

a pair of optical block alignment pins to couple to an alignment plate of an optical fiber receiver, the pair of optical block alignment pins to align the optical block to optical fibers.

53. The fiber optic transceiver of claim 48 for transmitting and receiving photons over optical fibers, wherein,
the first and fourth lenses are collimating lenses and the second and third lenses are focusing lenses.

54. The fiber optic transceiver of claim 53 for transmitting and receiving photons over optical fibers, wherein,
the first reflector is a mirror reflector and the second reflector is a beam shaper.

55. The fiber optic transceiver of claim 54 for transmitting and receiving photons over optical fibers, wherein,
the second reflector is an optical grating.

56. The fiber optic transceiver of claim 53 for transmitting and receiving photons over optical fibers, wherein,
the first reflector and the second reflector are mirror coated surfaces to reflect incident light.

57. A fiber optic module for coupling photons between an optoelectronic device and an optical fiber, the fiber optic module comprising:
a base having a slot and a plurality of pin holes, the base to mount the fiber optic module in a system for coupling photons between an optoelectronic device and an optical fiber;
a printed circuit board (PCB) inserted into the slot substantially perpendicular to the base, the PCB having a plurality of pins inserted into the plurality of pin holes and an optoelectronic device to communicate with an optical fiber using photons, the optoelectronic device having terminals coupled to the PCB;
an optical block coupled to the optoelectronic device of the PCB to couple photons between the optoelectronic device and an optical fiber, the optical block having a reflective surface to reflect photons between the optoelectronic device and the optical fiber, a first lens to focus photons and a second lens to collimate photons between the optoelectronic device and an optical fiber, the optical block coupled to the optoelectronic device such that an angle between the optoelectronic device and a line perpendicular to the reflective surface is not equal to forty five decrees or a multiple thereof; and
an optical fiber alignment plate having a pair of optical block holes to couple in alignment the alignment plate to the optical block, the alignment plate having an optical opening to allow passage of photons and a fiber optic post on a back side to couple in alignment an optical fiber with the optical opening.

58. The fiber optic module of claim 57 for coupling photons between an optoelectronic device and an optical fiber, the fiber optic module further comprising:
a nose coupled to the base, the nose to receive an optical fiber connector and hold an optical fiber substantially fixed and aligned with the optical opening of the alignment plate.

59. The fiber optic module of claim 58 for coupling photons between an optoelectronic device and an optical fiber, the fiber optic module further comprising:
a nose shield surrounding the nose to reduce electromagnetic interference.

60. A fiber optic transceiver for coupling photons between optoelectronic devices and optical fibers, the fiber optic transceiver comprising:
a base having a first slot near one side, a second slot near an opposite side of the first slot, a first plurality of pin holes near the one side and a second plurality of pin holes near the opposite side, the base to mount the fiber optic transceiver in a system for coupling photons between an optoelectronic device and an optical fiber;

a first printed circuit board (PCB) inserted into the first slot substantially perpendicular to the base, the first PCB having a plurality of pins inserted into the first plurality of pin holes and a first optoelectronic device to communicate with a first optical fiber using photons, the first optoelectronic device having terminals coupled to the first PCB;

a second PCB inserted into the second slot substantially perpendicular to the base, the second PCB having a second plurality of pins inserted into the second plurality of pin holes and a second optoelectronic device to communicate with a second optical fiber using photons, the second optoelectronic device having terminals coupled to the second PCB;

optical elements coupled to the first optoelectronic device of the first PCB to couple photons between the first optoelectronic device and a first optical fiber and the second optoelectronic device of the second PCB to couple photons between the second optoelectronic device and a second optical fiber, the optical elements having a first reflective surface and a second reflective surface, the optical elements coupled to the first optoelectronic device such that a first angle between the first optoelectronic device and a first line perpendicular to the first reflective surface is not equal to forty five degrees or a multiple thereof and the optical elements coupled to the second optoelectronic device such that a second angle between the second optoelectronic device and a second line perpendicular to the second reflective surface is not equal to forty five degrees or a multiple thereof, the optical elements further having a first lens to collimate photons and a third lens to focus photons between the first optoelectronic device and the first optical fiber, a second lens to focus photons and a fourth lens to collimate photons between the second optoelectronic device and the second optical fiber; and an optical fiber alignment plate having a pair of holes for coupling in alignment the alignment plate to the optical elements, the alignment plate having an optical opening to allow passage of photons and a pair of fiber optic alignment pins on a back side to couple in alignment a pair of optical fibers with the optical opening.

61. The fiber optic transceiver of claim 32 for coupling photons between optoelectronic devices and optical fibers, the fiber optic transceiver further comprising:

a nose coupled to the base, the nose to receive an optical fiber connector and hold a pair of optical fibers substantially fixed and aligned with the optical opening of the alignment plate.

62. The fiber optic transceiver of claim 61 for coupling photons between optoelectronic devices and optical fibers, the fiber optic transceiver further comprising:

a nose shield surrounding the nose to reduce electromagnetic interference.

63. A fiber optic transceiver for coupling photons between optoelectronic devices and optical fibers, the fiber optic transceiver comprising:

a base having a first slot near one side, a second slot near an opposite side of the first slot, a first plurality of pin holes near the one side and a second plurality of pin holes near the opposite side, the base to mount the fiber optic transceiver in a system for coupling photons between an optoelectronic device and an optical fiber;

a first printed circuit board (PCB) inserted into the first slot substantially perpendicular to the base, the first PCB having a plurality of pins inserted into the first plurality of pin holes and a first optoelectronic device to communicate with a first optical fiber using photons, the first optoelectronic device having terminals coupled to the first PCB;

a second PCB inserted into the second slot substantially perpendicular to the base, the second PCB having a second plurality of pins inserted into the second plurality of pin holes and a second optoelectronic device to communicate with a second optical fiber using photons, the second optoelectronic device having terminals coupled to the second PCB;

optical elements coupled to the first optoelectronic device of the first PCB to couple photons between the first optoelectronic device and a first optical fiber and the second optoelectronic device of the second PCB to couple photons between the second optoelectronic device and a second optical fiber, the optical elements having a first reflective surface and a second reflective surface, the optical elements coupled to the first optoelectronic device such that a first angle between the first optoelectronic device and a first line perpendicular to the first reflective surface is not equal to forty five degrees or a multiple thereof and the optical elements coupled to the second optoelectronic device such that a second angle between the second optoelectronic device and a second line perpendicular to the second reflective surface is not equal to forty five degrees or a multiple thereof; and wherein the first PCB and the second PCB are inserted into the first slot and second slot respectively such that the first electrical components are in between the first ground plane and the shielded housing and the second electrical components are in between the second ground plane and the shielded housing to reduce electrical crosstalk.

* * * * *